United States Patent

Hashimoto et al.

Patent Number: 5,614,316
Date of Patent: Mar. 25, 1997

[54] ADHESIVE TAPE FOR ELECTRONIC PARTS AND LIQUID ADHESIVE

[75] Inventors: Takeshi Hashimoto; Akira Tezuka; Takeshi Nishigaya; Fumiyoshi Yamanashi, all of Shizuoka, Japan

[73] Assignee: Tomoegawa Paper Co., Ltd., Tokyo, Japan

[21] Appl. No.: 636,444

[22] Filed: Apr. 23, 1996

[30] Foreign Application Priority Data

Jun. 8, 1995 [JP] Japan .................... 7-164496

[51] Int. Cl.⁶ .................. B32B 15/08; B32B 7/10; B32B 27/28
[52] U.S. Cl. .................. 428/344; 428/413; 428/41.4; 428/41.8; 428/212; 428/352; 428/354; 428/355 CN
[58] Field of Search .................. 428/344, 352, 428/354, 355, 462, 212, 41.3, 41.4, 41.8

[56] References Cited

U.S. PATENT DOCUMENTS 5,446,080  8/1995  Shima et al. .................. 524/99
5,494,757  2/1996  Sakumoto et al. .................. 428/447

FOREIGN PATENT DOCUMENTS 7-126591  5/1995  Japan .

*Primary Examiner*—Ana Woodward
*Attorney, Agent, or Firm*—Lowe, Price, LeBlanc & Becker

[57] ABSTRACT

This invention provide an adhesive tape by which adhesion to a metal spreader is not required and a cutting process is not necessary. The adhesive tape comprises an adhesive layer provided on at least one surface of metal sheet, said adhesive layer being semi-cured into a B-stage and comprised of: (a) a piperazinylethylaminocarbonyl-containing butadiene-acrylonitrile copolymer of the formula (I):

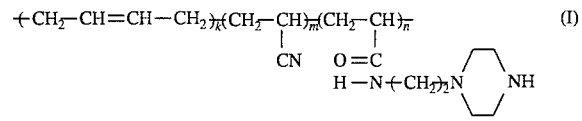

wherein, k, m, and n are molar ratios and taking n as 1, k is a number of 3–175, and m is a number of 0.3 to 93; and (b) a compound having at least two maleimide groups, the ratio of component (b) based on 100 parts by weight of component (a) being in a range of 10 to 900 parts by weight, and said adhesive layer being composed of at least two semi-cured layers having each a different status of semi-cure.

9 Claims, 1 Drawing Sheet

ADHESIVE TAPE FOR ELECTRONIC PARTS AND LIQUID ADHESIVE

BACKGROUND OF THE INVENTION

1. Field of the Invention

The present invention relates to adhesive tapes for electronic parts to be used for adhering between parts around leadframes making up a semiconductor device, e.g., lead pins, semiconductor chip mounted substrates, heat spreader, semiconductors themselves.

2. Description of the Related Art

Conventionally, adhesive tapes for fixing a leadframe, TAB tapes, etc., are used as adhesive tapes for use in the interior of resin-molded type semiconductor devices. For example, the adhesive tapes for fixing a leadframe have been used to fix lead pins of the leadframe in order to enhance the efficiency for producing the leadframe itself and the whole semiconductor assembly stages. In general, a leadframe manufacturer tapes a leadframe, and brings it to a semiconductor manufacturer, at which a chip is mounted thereon followed by molding the leadframe with a resin. For this reason, it has been required for the adhesive tapes for fixing the leadframe not only to possess general reliability in a level required for semiconductor and enough processability at the time of taping, but also to possess sufficient adhesive strength immediately after taping and heat resistance enough for withstanding thermal process at the stages of assembling semiconductor devices.

Conventionally, the adhesive tapes for use in such an application include adhesive tapes applying on a support film of a polyimide film, etc., an adhesive comprising a synthetic rubber resin such as polyacrylonitrile, polyacrylate or acrylonitrile-butadiene copolymer solely, or modified with any other resin or blended with any other resin to come into a B-stage.

In recent years, resin-molded type semiconductor devices (semiconductor package) shown in FIG. 2 has been developed or produced. In FIG. 2, the device has a construction in which lead pins 3 and metal plane 2 are connected by means of an adhesive layer 6, a semiconductor chip 1 is mounted on the metal plane 2, and together with bonding wires 4 between the semiconductor chip 1 and the lead pins 3, they are molded with a resin 5.

In the adhesive layer in the resin-molded type semiconductor device shown in FIG. 2, the use of an adhesive tape to which a conventional adhesive is applied has the problems such as insufficient heat resistance. Also, in the case of the application of polyimide resin, the conditions of temperature and pressure for taping and conditions for curing are severe so that the metal material, such as leadframe, are damaged. Consequently, it has been desired to develop an adhesive for electronic parts which can be bonded and cured at a relatively low temperature, and which has sufficient heat resistance and reliability, etc.

The present inventors have proposed an adhesive tape using an ahdesive comprising a piperazinylethylamino-carbonyl-containing butadiene-acrylonitrile copolymer represented by the under-mentioned formula (I) and a compound having at least 2 maleimide groups (Japanese Patent Application Laid-Open 126591/1995), whereby the above problems are dissolved.

However, there are still problems in this adhesive tape when the semiconductor device shown in FIG. 2 is produced. In order to produce the semiconductor device shown in FIG. 2, a tape having an adhesive layer on each side thereof is used for fixing the leadframe and the metal plane. In this case, after the tape is cut by a mold in every 1 piece, the piece of the tape is laminated with the leadframe and the plane, and they are bonded by pressing under heat. This process requires much cost. Also, it is necessary to change the mold for cutting the tape when the design of the leadframe or the plane is changed.

SUMMARY OF THE INVENTION

The present invention has been done in order to solve the above described problems. The object of the present invention is, therefore, to provide an adhesive tape which can be adhered and cured at a relatively low temperature, can keep enough electric insulation in case of adhering to the leadframe, and can produce electronic parts with enough reliability without carrying out a step of bonding the adhesive tape to the plane.

The first adhesive tape for electronic parts of the present invention comprises an adhesive layer provided on a surface of a metal sheet, said adhesive layer being semi-cured into a B-stage and comprised of: (a) a piperazinylethylaminocarbonyl-containing butadiene-acrylonitrile copolymer having weight average molecular weight of 10,000–200,000, acrylonitrile content of 5–50% by weight, and amino equivalent of 500–10,000, represented by the following formula (I):

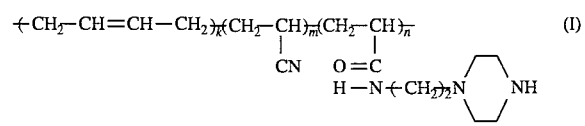

wherein, k, m, and n are molar ratios and taking n as 1, k is a number of 3–175, and m is a number of 0.3 to 93; and (b) a compound having at least two maleimide groups selected from the compounds represented by the following formulae (II-1) to (II-6):

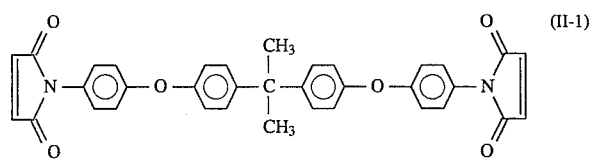

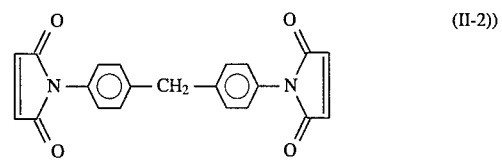

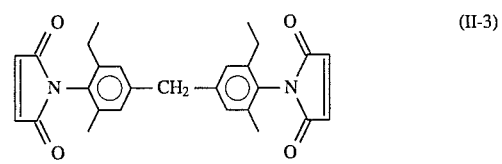

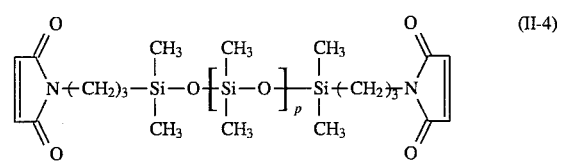

wherein p is an integer of from 0 to 7,

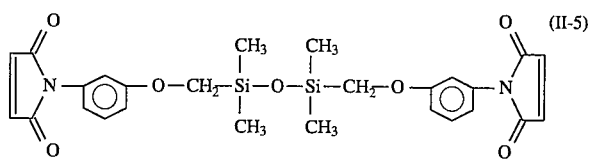

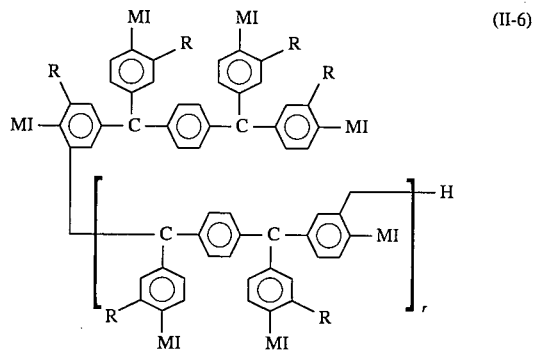

wherein MI=maleimide group, R=H or CH₃, and r=1–5; the ratio of component (b) based on 100 parts by weight of component (a) being in a range of 10 to 900 parts by weight, said adhesive layer being composed of at least two semi-cured layers which are cured into a B-stage and have each a different status of semi-cure, and the semi-cured layer having a higher status of semi-cure being positioned by the side of the metal sheet.

The second adhesive tape for electronic parts of the present invention comprises two adhesive layers, one of which is provided on one side of a metal sheet and the other is provided on the other side of said metal sheet, said adhesive layers being semi-cured into a B-stage and comprised of: (a) a piperazinylethylaminocarbonyl-containing butadiene-acrylonitrile copolymer having a weight average molecular weight of 10,000–200,000, an acrylonitrile content of 5–50% by weight, and an amino equivalent of 500–10,000, represented by the above-mentioned formula (I):and (b) a compound having at least two maleimide groups selected from the compounds represented by the above mentioned formulae (II-1) to (II-6); the ratio of component (b) based on 100 parts by weight of component (a) being in a range of 10 to 900 parts by weight, at least one of said adhesive layers being composed of at least two semi-cured layers having each a different status of semi-cure, and the semi-cured layer having a higher status of semi-cure being positioned by the side of the metal sheet.

The third adhesive tape for electronic parts of the present invention comprises an adhesive layer provided on a surface of metal sheet, said adhesive layer being semi-cured into a B-stage and comprised of: (a) the above-mentioned piperazinylethylaminocarbonyl-containing butadiene-acrylonitrile copolymer of the above-mentioned component (a), (b) a compound having at least two maleimide groups of the above-mentioned component (b), and (c) a diamine compound represented by formula (III):

$$H_2N-R^1-NH_2 \quad (III)$$

wherein $R^1$ is a divalent aliphatic, aromatic, or alicyclic group, or an amino-containing polysiloxane having a weight average molecular weight of 200–7,000 represented by the formula (IV):

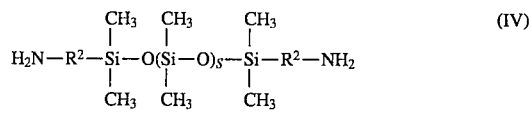

wherein $R^2$ is a divalent aliphatic, aromatic, or alicyclic group, and s is an integer of from 0 to 7, the total amount of components (b) and (c) based on 100 parts by weight of component (a) being 10 to 900 parts by weight, and the molar equivalent of the maleimide group in component (b) per molar equivalent of the amino group in component (c) being 1 to 100 molar equivalent, said adhesive layer being composed of at least two semi-cured layers having each a different status of semi-cure, and the semi-cured layer having a higher status of semi-cure being positioned by the side of the metal sheet.

The fourth adhesive tape for electronic parts of the present invention comprises two adhesive layers, one of which is provided on one side of a metal sheet and the other is provided on the other side of said metal sheet, said adhesive layers being semi-cured into a B-stage and comprised of: (a)the above-mentioned piperazinylethylaminocarbonyl-containing butadiene-acrylonitrile copolymer of the above-mentioned component (a), (b) a compound having at least two maleimide groups of the above-mentioned component (b), and (c) a diamine compound represented by the above mentioned formula (III): or an amino-containing polysiloxane having a weight average molecular weight of 200–7,000 represented by the above mentioned formula (IV): the total amount of components (b) and (c) based on 100 parts by weight of component (a) being 10 to 900 parts by weight, and the molar equivalent of the maleimide group in component (b) per molar equivalent of the amino group in component (c) being 1 to 100 molar equivalent, at least one of said adhesive layers being composed of at least two semi-cured layers having each a different status of semi-cure, and the semi-cured layer having a higher status of semi-cure being located by the side of the metal sheet.

In the first to the fourth adhesive tapes for electronic parts present invention, it is preferred to provide a release film on the adhesive layer.

DETAILED DESCRIPTION OF PREFERRED EMBODIMENTS

Figure 1:
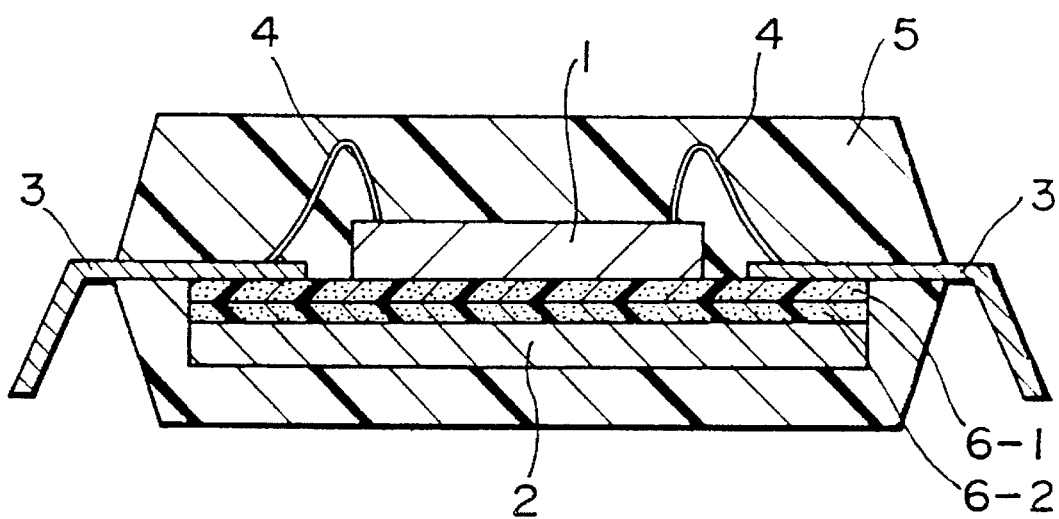
FIG. 1 is a cross-sectional view showing one example of a resin-molded semiconductor device constructed using an adhesive tape of the present invention.
Figure 2:
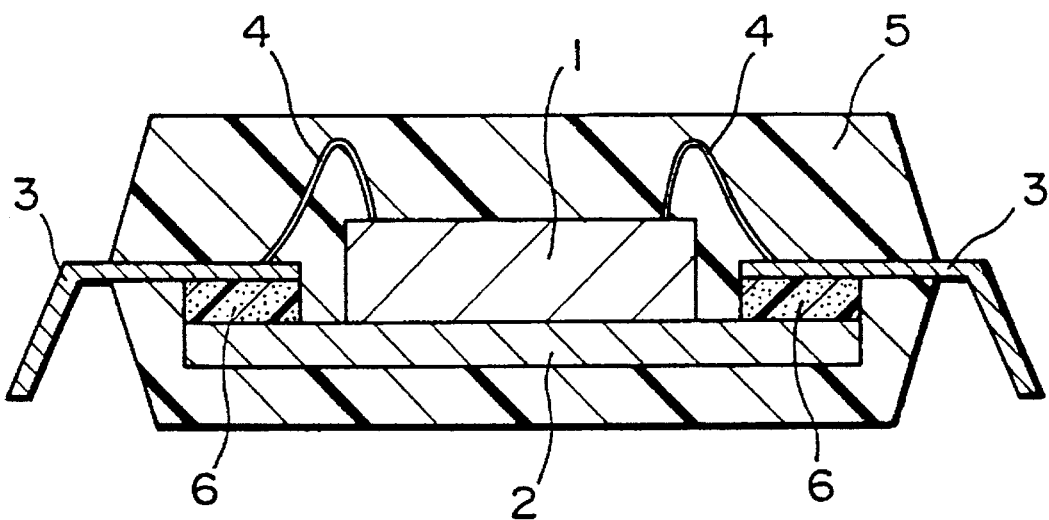
FIG. 2 is a cross-sectional view showing an example of a resin-molded semiconductor device constructed using a conventional adhesive tape.

The present invention will now be described in detail. First of all, a liquid adhesive for using in the first and the second adhesive tapes for electronic parts of the present invention (the first liquid adhesive) will now be described.

The piperazinylethylaminocarbonyl-containing butadiene-acrylonitrile copolymers having weight average molecular weight of 10,000–200,000, acrylonitrile content of 5–50% by weight, and amino equivalent of 500–10,000, represented by the above-mentioned formula (I) to be used as component (a) is a novel substance, which can be synthesized by the condensation of carboxyl-containing butadiene-acrylonitrile copolymers represented by the following formula (V) with N-aminoethylpiperazine in the presence of, for example, a phosphite.

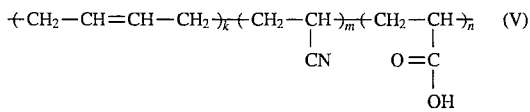

wherein, k, m, and n are molar ratios and taking n as 1, k is a number of 3–175, and m is a number of 0.3 to 93.

The piperazinylethylaminocarbonyl-containing butadiene-acrylonitrile copolymers which can be used in the present invention are those having weight average molecular weight of 10,000 to 200,000, preferably 20,000 to 150,000, acrylonitrile content of 5–50% by weight, preferably 10–40% by weight, and amino equivalent of 500–10,000, preferably 1,000–8,000.

In this case, if the weight average molecular weight is lower than 10,000, the heat stability becomes insufficient leading to a decrease in heat resistance. If It is higher than 200,000, the solubility in the solvent becomes poor, and the melt viscosity is unduly increased, resulting in poor processability when used as an adhesive and in poor adhesive properties. If the acrylonitrile content is less than 5% by weight, the solubility in the solvent becomes low, and, conversely, if it is higher than 50% by weight, the insulating properties become unstable. If the amino equivalent is less than 500, the solubility in the solvent becomes low, while if it exceeds 10,000, the viscosity becomes too low when used as an adhesive by mixing with the maleimide compound, resulting in decreased processability.

In the first liquid adhesive, the ratio of component (a) to component (b) is set so that the ratio of component (b) based on 100 parts by weight of component (a) is in the range of 10–900 parts by weight, preferably 20–800 parts by weight. If the amount of component (b) is less than 10 parts by weight, the heat resistance of the adhesive after the coating and curing, especially Tg, and Young's modulus, is remarkably degraded, leading to an adhesive unsuitable for the intended purpose. Conversely, if it exceeds 900 parts by weight, the adhesive itself becomes brittle and has inferior processability or has poor adhesion properties to the heat resistant film as the substrate, when cured into the B-stage.

The mixing of the above-mentioned components (a) and (b) is carried out in a solvent which dissolves both components. Examples of solvents which can be mentioned are N-dimethylformamide, N,N-dimethylacetamide, N-methylpyrrolidone, 1,3-dimethyl-2-imidazoline, dimethylsulfoxide, hexamethylphosphoric triamide, hexane, benzene, toluene, xylene, methanol, ethanol, propanol, isopropanol, diethylether, tetrahydrofuran, methyl acetate, ethyl acetate, acetonitrile, dichloromethane, chloroform, carbon tetrachloride, chlorobenzene, dichlorobenzene, dichloroethane, trichloroethane, etc., and the type and amount of solvent are appropriately selected so that both components (a) and (b) are dissolved therein.

A liquid adhesive for using in the third and the fourth adhesive tapes for electronic parts of the present invention (the second liquid adhesive) comprises a diamine compound represented by the above formula (III) or an amino-containing polysiloxane compound having weight average molecular weight of 200–7,000 represented by the above formula (IV) as component (c), in addition to components (a) and (b).

In this case, the ratios of component (a) to component (b) to component (c) are set such that the total amount of components (b) plus (c) is 10 to 900 parts by weight, preferably 20 to 800 parts by weight, based on 100 parts by weight of component (a). If the total amount of components (a) plus (b) is less than 10 parts by weight, the heat resistance of the adhesive layer, after coated and cured, especially Tg and the Young's modulus, is markedly decreased, making it unsuitable for an intended use. If it exceeds more than 900 parts by weight, the adhesive layer itself, when cured into the B-stage, becomes brittle leading to poor processability.

It is necessary for the ratio of component (a) to component (b) to component (c) to be a molar equivalent of maleimide in component (b) in the range of 1 to 100 mol equivalent per molar equivalent of the amino group in component (c), and preferably the molar equivalent is set to be in the range of 1 to 80. If the molar equivalent of the meleimide in component (b) is less than 1, gelatinization takes place at the time of mixing so that the adhesive cannot be prepared. If it exceeds 100 molar equivalent, the adhesive itself, when cured into the B-stage, becomes brittle leading to poor processability.

Examples of the diamine compounds represented by the above formula (III), which can be used as component (c) include N,N'-bis(2-aminophenyl)isophthalamide, N,N'-bis(3-aminophenyl)isophthalamide, N,N'-bis(4-aminophenyl)-isophthalamide, N,N'-bis(2-aminophenyl)-terephthalamide, N,N'-bis(3-aminophenyl)terephthalamide, N,N'-bis(4-aminophenyl)terephthalamide, N,N'-bis(2-aminophenyl)-phthalamide, N,N'-bis(3-aminophenyl)-phthalamide, N,N'-bis(4-aminophenyl)phthalamide, N,N'-bis(2-aminophenyl)phthalamide, N,N'-bis(4-amino-3,5-dimethylphenyl)isophthalamide, N,N'-bis(4-amino-3,5-dimethylphenyl)terephthalamide, N,N'-bis(4-amino-3,5-dimethylphenyl)phthalamide, N,N'-bis(2-amino-n-butylphenyl)isophthalamide, N,N'-bis(4-amino-n-butylphenyl)isophthalamide, N,N'-bis(4-amino-n-hexylphenyl)isophthalamide, N,N'-bis(4-amino-n-dodecylphenyl)isophthalamide, m-phenylenediamine, p-phenylenediamine, m-tolylenediamine, 4,4'-diaminodiphenyl ether, 3,3'-dimethyl-4,4'-diaminodiphenyl ether, 3,3'-diaminodiphenyl ether, 3,4'-diaminodiphenyl ether, 4,4'-diaminodiphenyl thioether, 3,3'-dimethyl-4,4'-diaminodiphenyl thioether, 3,3'-diethoxy-4,4'-diaminodiphenyl thioether, 3,3'-diaminodiphenyl thioether, 4,4'-diaminobenzophenone, 3,3'-dimethyl-4,4'-diaminobenzophenone, 3,3'-diaminodiphenylmethane, 4,4'-diaminodiphenylmethane, 3,3'-dimethoxy-4,4'-diaminodiphenylmethane, 2,2'-bis(4-aminophenyl)propane, 2,2'-bis(3-aminophenyl)propane, 4,4'-diaminodiphenyl-sulfoxide, 4,4'-diaminodiphenylsulfone, 3,3'-diaminophenylsulfone, benzidine, 3,3'-dimethylbenzidine, 3,3'-dimethoxybenzidine, 3,3'-diaminobiphenyl, 2,2-bis[4-(4-aminophenoxy)phenyl]propane, 2,2-bis[3-methyl-4-(4-aminophenoxy)phenyl]propane, 2,2-bis[3-chloro-4-(4-aminophenoxy)phenyl]propane, 2,2-bis[3,5-dimethyl-4-(4-aminophenoxy)phenyl]propane, 1,1-bis[4-(4-aminophenoxy)phenyl]ethane, 1,1-bis[3-chloro-4-(4-aminophenoxy)phenyl]ethane, bis[4-(4-aminophenoxy)phenyl]methane, bis[3-methyl-4(4-aminophenoxy) phenyl]methane, piperazine, hexamethylenediamine, heptamethylenediamine, tetramethylenediamine, p-xylenediamine, m-xylenediamine, 3-methylheptamethylene-diamine, 1,3-bis(4-aminophenoxy)benzene, 2,2-bis(4-aminophenyl)-1,1,1,3,3,3-hexafluoropropane, 2,2-bis[4-(4-aminophenoxy)phenyl]-1,1,1,3,3,3-hexafluoropropane, [1,4-phenylene-bis(1-methylethylidene)]-bisaniline, 4,4'-[1,3-phenylene-bis(1-methylethylidene)]-bisaniline, 4,4'-[1,4-phenylene-bis(1-methylethylidene)]-bis(2,6-dimethylbisaniline), etc.

Examples of the amino-containing polysiloxane compound having weight average molecular weight of 200–7,000 represented by the above formula (IV) include 1,3-bis(3-aminopropyl)-1,1,3,3-tetramethyldisiloxane, α, ω-bis(3-aminopropyl)polydimethylslloxane, 1,3-bis(3-aminophenoxymethyl)-1,1,3,3-tetramethyldisiloxane, α, ω-bis-(3-aminophenoxy)polydimethylsiloxane, 1,3-bis[2-(3-aminophenoxymethyl)ethyl]-1,1,3,3-tetramethyldisiloxane, α, ω-bis[2-(3-aminophenoxy)ethyl]polydimethylsiloxane, 1,3-bis[3-(3-aminophenoxy)propyl]-1,1,3,3-tetramethyl-disiloxane, α, ω-bis[3-(3-aminophenoxy)propyl]-polydimethylsiloxane, etc.

The mixing of components (a), (b), and (c) are carried out in a solvent which dissolves these components. The solvents which can be used are those exemplified in the first liquid adhesive.

In order to accelerate the addition reaction between components (a) and (b) and the addition reaction between two or more of components (b), to the first and second liquid adhesives of the present invention may optionally be added diazabicyclooctane or organic peroxides such as methyl ethyl ketone peroxide, cyclohexane peroxide, 3,3,5-trimethylcyclohexanone peroxide, methylcyclohexanone peroxide, methylacetoacetate peroxide, acetylacetone peroxide, 1,1-bis(t-butylperoxy)-3,3,5-trimethyl-cyclohexane, 1,1-bis(t-butylperoxy)cyclohexane, 2,2-bis(t-butylperoxy)octane, n-butyl-4,4-bis(t-butylperoxy)valerate, 2,2-bis(t-butylperoxy)butane, t-butyl hydroperoxide, cumene hydroperoxide, di-isopropylbenzene hydroperoxide, p-mentane hydroperoxide, 2,5-dimethylhexane-2,5-dihydroperoxide, 1,1,3,3-tetramethylbutyl hydroperoxide, di-t-butyl peroxide, t-butylcumyl peroxide, dicumyl peroxide, α, α'-bis(t-butylperoxy-m-isopropyl)benzene, 2,5-dimethyl-2,5-di-(t-butylperoxy)hexane, 2,5-dimethyl-2,5-di(t-butylperoxy)hexane, acetyl peroxide, isobutyl peroxide, octanoyl peroxide, decanoyl peroxide, benzoyl peroxide, lauroyl peroxide, 3,5,5-trimethylhexanoyl peroxide, succinic acid peroxide, 2,4-dichlorobenzoyl peroxide, m-toluoyl peroxide, diisopropylperoxy dicarbonate, di-2-ethylhexylperoxy dicarbonate, di-n-propylperoxy dicarbonate, bis-(4-t-butylcyclohexyl)peroxy dicarbonate, dimyristylperoxy dicarbonate, di-2-ethoxyethylperoxy dicarbonate, dimethoxyisopropylperoxy dicarbonate, di-(3-methyl-3-methoxybutyl)peroxy dicarbonate, di-allylperoxy dicarbonate, t-butylperoxy acetate, t-butylperoxy isobutyrate, t-butylperoxy pivalate, t-butylperoxy neodecanate, cumylperoxy neododecanate, t-butylperoxy 2-ethylhexanate, t-butylperoxy-3,5,5-trimethylhexanate, t-butylperoxy laurate, t-butylperoxy dibenzoate, di-t-butylperoxy isophthalate, 2,5-dimethyl-2,5-di-(benzoylperoxy)hexane, t-butylperoxy maleic acid, t-butylperoxy isopropylcarbonate, cumylperoxy octate, t-hexylperoxy neodecanate, t-hexylperoxy pivalate, t-butylperoxy neohexanate, t-hexylperoxy neohexanate, cumylperoxy neohexanate, acetylcyclohexylsulfonyl peroxide, and t-butylperoxy allylcarbonate; and imidazoles such as 1,2-dimethylimidazole, 1-methyl-2-ethylimidazole, 2-methylimidazole, 2-ethyl-4-methylimidazole, 2-undecylimidazole, 2-heptadecylimidazole, 2-phenylimidazole, 1-benzyl,2-methylimidazole, 1-benzyl-2-phenylimidazole, 1-benzyl-2-phenylimidazole trimellitate, 1-benzyl- ethylimidazole, 1-benzyl-2-ethyl-5-methylimidazole, 2-ethylimidazole, 2-isopropylimidazole, 2-phenyl-4benzylimidazole, 1-cyanoethyl-2-methylimidazole, 1-cyanoethyl-2-ethyl-4-methylimidazole, 1-cyanoethyl-2-undecylimidazole, 1-cyanoethyl-2-isopropylimidazole, 1-cyanoethyl-2-phenylimldazole, 1-cyanoethyl-2-methylimidazolium trimellitate, 1-cyanoethyl-2-ethyl-4-methylimidazolium trimellitate, 1-cyanoethyl-2-phenylimidazolium trimellitate, 2,4-diamino-6-[2'-methylimidazolyl-(1)']-ethyl-S-triazine, 2,4-diamino-6-[2'-ethyl-4-methylimidazolyl-(1)']-ethyl-S-triazine, 2,4-diamino-6-[2'-undecylimidazolyl-(1)']-ethyl-S-triazine, isocyanuric acid adduct of 2-methylimidazolium, isocyanuric acid adduct of 2-phenylimidazolium, isocyanuric acid adduct of 2,4-diamino-6-[2'-methylimidazole-(1)']-ethyl-S-triazine, 2-phenyl-4,5-dihydroxymethylimidazole, 2-phenyl-4-methyl-5-hydroxymethylimidazole, 2-phenyl-4-benzyl-5-hydroxymethylimidazole, 4,4'-methylene-bis-(2-ethyl-5-methylimidazole), 1-aminoethyl-2-methylimidazole, 1-cyanoethyl-2-phenyl-4,5-di(cyanoethyoxymethyl)imidazole, 1-dodecyl-2-methyl-3-benzylimidazolium chloride, 4,4'-methylene-bis-(2-ethyl-5-methylimidazole), 2-methylimidazole-benzotriazole adduct, 1,2-dimethylimidazole-benzotriazole adduct, 1-aminoethyl-2-ethylimidazole, 1-(cyanoethylaminoethyl)-2-methylimidazole, N,N'-[2-methylimidazolyl-(1)-ethyl]-adipoyldiamide, N,N'-bis-(2-methylimidazolyl-1-ethyl)urea, N-[2-methylimidazolyl-1-ethyl]-urea, N,N'-[2-methylimidazolyl-(1)-ethyl]-dodecanedioyldiamide, N,N'-[2-methylimidazolyl-(1)-ethyl]-eicosanedioyldiamlde, 1-benzyl-2-phenylimidazole hydrochloride, and 1-cyanoethyl-2-phenyl-4,5-di(cyanoethoxylmethyl)imidazole; and reaction accelerators such as triphenyl phosphine. It becomes possible to precure the adhesive layer so as to have a desired status of semi-cure by controlling the amount of the above reaction accelerators.

Into the first and second liquid adhesives in the present invention may be incorporated a filler having a particle size of about 1 μm or less in order to stabilize the taping characteristics of the adhesives. The filler content is set to be 4–40% by weight, preferably 9–24% by weight of the total solid content. If the content is less than 4% by weight, the effect for stabilizing the taping characteristics on taping becomes low. If it exceeds 40% by weight, the adhesion strength of the adhesive tape becomes low and the processability such as for lamination becomes poor.

Examples of fillers which can be used include silica, quartz powder, alumina, calcium carbonate, magnesium oxide, diamond powder, mica, fluorinated resin powder, zircon powder, etc.

The adhesive tapes according to the present invention can be produced using the above described the first and the second liquid adhesives. The adhesive layer formed on the metal sheet which is cured into a B-stage is composed of at least two semi-cured layers having each a different status of semi-cure. In this case, it is necessary to provide the semi-cured layer on at least a surface of the metal sheet such that the semi-cured layer having a higher status of semi-cure is positioned by the side of the metal sheet and the semi-cured layer having a lower degree of curing is positioned away from the metal sheet. Each of the semi-cured layers is prefered to have a thickness in a range of 5–100 μm, and particularly 10–50 μm.

As the metal sheet, those having thickness of 10–200 μm can be used, which functions as a heat spreader. The metal sheet may be made of materials selected from copper, cupro-nickel, silver, iron, 42-alloy and stainless steel.

In the present invention, it is preferred that the semi-cured adhesive layer having a hihger status of semi-cure provided on the metal sheet has slipping velocity in a range of 0.01–0.3 μm/sec, and the semi-cured layer having a lower status of semi-cure has a slipping velocity in a range of 0.1–10.0 μm/sec, and that the slipping velocity ($V_1$) of the semi-cured layer having a higher status of semi-cure and the slipping velocity ($V_2$) of the semi-cured layer having a lower status of semi-cure has the relation of $V_2 > V_1$.

If $V_1$ in the two semi-cured layer is beyond 0.3 μm/sec, the lead pins are embedded in the adhesve layer and easily contact with the substance to be adhered, such as metal heat spreader, etc., by which it becomes difficult to keep electric insulation. On the other hand, if $V_1$ is below 0.01 μm/sec, there is the possibility of deteriorating the adhesive property of the adhesive layer to the substance to be adhered. If $V_2$ is beyond 10 μ m/sec, the adhesive layer is forced out of edges of the adhesive tape to cause determination of the leadframe. On the other hand, it is not preferred that $V_2$ is below 0.1 μ m/sec, because the adhesive property of the adhered matter to the leadframe deteriorates.

In case that the second and the fourth adhesive tapes, the adhesive layer provided on the other side of the metal sheet may be constructed of a plurity of B-stage semi-cured layers having each a different status of semi-cure. Preferred examples of the second and the fourth adhesive tapes include the following tapes; that is, those wherein the B-stage semi-cured layer on the other side of the metal is composed of (1) only the semi-cured layer having a higher status of semi-cure, (2) only the semi-cured layer having a lower status of semi-cure, and (3) a semi-cured layer having a higher status of semi-cure and a semi-cured layer having a lower status of semi-cure in which the former is positioned by the side of the metal sheet. The above case (2) in which the slipping velocity of 0.01 to 0.3 μm/sec is particularly preferred. In case of these adhesive tapes, there is an advantage that, when the semiconductor device is produced using these adhesive tapes and hermetically sealed with a resin such as epoxy resin etc., it becomes difficut to cause delamination between the metal plate and the resin used for sealing.

The slipping velocity of the semi-cured layers cured into a B-stage is the value which means the status of semi-cure and is measured by the following method. Two samples are produced by cutting the tape to be measured into 5 mm×20 mm size. After one sample is put on the other sample so as to overlap only the edge parts of 5 mm from the edge, they are bonded by passing through a pair of heating rolls of 150° C. at roll rate of 1 m/min. After the resulted sample was kept at 23±3° C. and 65±5% RH for 48±12 hours, both ends of the bonded sample are chucked by a thermal mechanical analyzer (TM-3000, produced by Shinkuuriko Co.) and they are pulled in both directions under a load of 5 g while heating from 25° C. to 200° C. a rate of 10° C./min. Each sliding length (distance of movement) in the bonded part per unit time is measured and plotted. The sliding length (μm/sec) where the maximum sliding length per unit time occured is evaluated as the slipping velocity of the semi-cured layer.

In the following, the process for producing adhesive tapes for adhesive tapes for electronic parts of the present invention in which the above described the first and the second liquid adhesives are used will be explained.

The adhesive tapes for electronic parts are produced using the above liquid adhesive by forming at least two semi-cured layers having each a different status of semi-cure on a surface of a metal sheet. In this case, in order to form at least two semi-cured layers having each a different status of semi-cure, various kinds of processes can be adopted by combining various treatments, such as addition of the reaction accelerators, application of the liquid adhesives, pre-curing condition after drying, lamination of adhesive layers, etc.

Specifically, in case of forming, for example, the adhesive layer of two-layer structure, it is possible to use the following processes, that is, (1) a process which comprises applying the above mentioned liquid adhesive to a surface of two releasing films respectively, drying to form two uncured adhesive sheets, curing them under each a different condition to form two B-stage cured adhesive sheets having each a different status of semi-cure, bonding these two adhesive sheets, and bonding the resultant laminate to a side of a metal sheet, (2) a process which comprises applying the above mentioned liquid adhesive to a surface of a release film, superposing it on a surface of a copper sheet, curing the laminate, removing the release film, and bonding with a laminate prepared by applying the above mentioned liquid adhesive on a surface of another release film, (3) a process which comprises applying the above mentioned liquid adhesive to a surface of a metal sheet and a surface of a release film respectively, curing them by heating directly to form a semi-cured layer having a higher status of semi-cure on the surface of the metal sheet and a semi-cured layer having a lower status of semi-cure on the surface of the release film, and bonding them, (4) a process which comprises applying the above-mentioned liquid adhesive to a side or both sides of the metal sheet to produce a B-stage cured adhesive sheet having a desired status of semi-cure, coating one or both of them with the uncured liquid adhesive, and pre-curing the resultant laminate, (5) a process which comprises preparing two uncured adhesive sheets by applying two liquid adhesives having each the same composition except for the amount of the reaction accelerator, pre-curing these two adhesive sheet under the same condition, bonding both of them, and bonding the laminate to a copper sheet, (6) a process which comprises applying the above liquid adhesive to one side or both sides of a metal sheet to form a B-stage cured adhesive layer having a suitable status of semi-cure, applying a liquid adhesive having a different amount of the reaction accelerator from that of the above liquid adhesive to said B-stage cured adhesive layer, and pre-curing it under the same condition, and (7) a process which comprises coating both sides of a metal sheet with a liquid adhesive, curing it to form a laminate, and bonding it with a laminate prepared by applying a liquid adhesive to a surface of a release film.

An example of the resin-molded type semiconductor device using an adhesive tape of the present invention is shown in FIG. 1 as a cross-sectional view. In FIG. 1, the device has a construction in which lead pins 3 and metal plane 2 are connected by means of an adhesive layer 6, a semiconductor chip 1 is mounted on the metal plane 2, and together with bonding wires 4 between the semiconductor chip 1 and the lead pins 3, they are molded with a resin 5, wherein the adhesive layer 6 is constructed of two layer, that is, a semi-cured layer having a higher status of semi-cure 6-2 positioned adjacent to the metal plane and a semi-cured layer having a lower status of semi-cure 6-1. The metal plane in the FIG. 1 corresponds to the metal sheet of the adhesive tape according to the present invention.

The adhesive tape for electronic parts of the present invention having the above construction can be adhered and cured at a relatively low temperature, and has sufficient heat resistance and reliability. Accordingly, it can suitably be used as an adhesive tape for the innerlead fix of a leadframe and a TAB tape, e.g., for adhering between parts constituting a semiconductor device, for example, lead pins, semiconductor-mounted substrates, heat spreaders, semiconductor chips themselves. Moreover, when the adhesive tape is used for the leadpins, good electric insulation is kept because the leadpins do not embed in the adhesive layer of the adhesive tape when curing treatment is carried out, and, consequently, semi-conductor devices having good reliability can be obtained.

EXAMPLES

Example 1

30 parts by weight of a piperazinylethylamino-carbonyl-containing butadiene-acrylonitrile copolymer having weight average molecular weight: 70,000, an acrylonitrile content: 25% by weight and amino equivalent: 4,000 (k=55, m=18, n=1), 70 parts by weight of a compound represented by the above mentioned formula (II-1), and 1 part by weight of benzoyl peroxide were added to, mixed with and well dissolved in tetrahydrofuran to obtain a liquid adhesive having a solid content of 40% by weight. This liquid adhesive was coated to dry thickness of 20 µm on a surface of a polyethylene terephthalate film having thickness of 38 µm which was subjected to release treatment (referr to as "release film" in the following examples), followed by drying at 120° C. for 5 minutes in a hot-air circulating dryer to produce an uncured adhesive sheet.

Two of the above described uncured adhesive sheet were prepared, one of which was pre-cured at 100° C. for 12 hours in the hot-air circulating dryer to produce a B-stage cured adhesive sheet (a) having slipping velocity of 0.02 µ m/sec.

The other uncured adhesive sheet was precured at 70° C. for 12 hours in the hot-air circulating dryer to produce a B-stage cured adhesive sheet (b) having slipping velocity of 0.30 µm/sec.

The above mentioned B-stage cured adhesive sheets (a) and (b) were superposed so as to oppose each adhesive layer of them, and they were bonded by passing through a pair of heating rolls heated to 140° C. at roll rate of 1 m/min to produce an adhesive tape (c) having an adhesive layer composed of 2-layer structure.

Thereafter, the release film on the adhesive layer having slipping velocity of 0.02 µm/sec was removed from the adhesive tape (c). This adhesive tape was superposed on a surface of a 50 µm thickness copper sheet, followed by bonding them by passing through a pair of heating rolls heated to 140° C. at roll rate of 1 m/min to produce an adhesive tape having an adhesive layer of 2-layer structure on the copper sheet.

Hereinafter, the description of bonding conditions is omitted, because the bonding conditions in the following examples are the same as those of Example 1.

Example 2

An adhesive tape having an adhesive layer of 2-layer structure on a surface of a copper sheet was produced by the same manner as in Example 1 except that the thickness of the copper sheet was changed from 50 µm to 100 µm.

Example 3

An adhesive tape having an adhesive layer of 2-layer structure on a surface of a copper sheet was produced by the same manner as in Example 1 except that the thickness of the copper sheet was changed from 50 µm to 200 µm.

Example 4

An adhesive tape having an adhesive layer of 2-layer structure on a surface of acupro-nickel sheet was produced by the same manner as in Example 1 except that the 50 µm thickness copper sheet was changed into the 100 µm thickness cupro-nickel sheet.

Example 5

An adhesive tape having an adhesive layer of 2-layer structure on a surface of a 42-alloy sheet was produced by the same manner as in Example 1 except that the 50 µm thickness copper sheet was changed into the 100 µm thickness 42-alloy sheet.

Example 6

An adhesive tape having an adhesive layer of 2-layer structure on a surface of a silver sheet was produced by the same manner as in Example 1 except that the 50 µm thickness copper sheet was changed into the 100 µm thickness silver sheet.

Example 7

An adhesive tape having an adhesive layer of 2-layer structure on a surface of a stainless steel sheet was produced by the same manner as in Example 1 except that the 50 µm thickness copper sheet was changed into the 100 µm thickness stalless steel sheet.

Example 8

The liquid adhesive in Example 1 was applied to a surface of the release film so as to give dry thickness of 20 µm, followed by drying at 120° C. for 5 minutes by a hot-air circulating dryer to produce an uncured adhesive film.

Two of the above mentioned uncured adhesive sheet were prepared, one of which was superposed on a side of a 100 µm thickness copper sheet and bonded thereto by passing through a pair of heating rolls heated to 140° C. at roll rate of 1 m/min. The resultant laminate was then pre-cured at 100° C. for 12 hours in the hot-air circulating dryer to produce a B-stage cured adhesive sheet (a) having slipping velocity of 0.02 µm/sec.

The other uncured adhesive sheet was pre-cured at 70° C. for 12 hours in the hot-air circulating dryer to produce a B-stage cured adhesive sheet (b) having slipping velocity of 0.30 µm/sec.

After the release film was removed from the B-stage cured adhesive sheet (a), the adhesive sheet (a) was superposed on a surface of the B-stage cured adhesive sheet (b) so as to oppose each adhesive layer of them, followed by bonding them to produce an adhesive tape having an adhesive layer of 2-layer structure on a side of the copper sheet.

Example 9

The liquid adhesive in Example 1 was applied to a surface of a release film so as to give dry thickness of 20 µm, followed by drying at 180° C. for 5 minutes by a hot-air circulating dryer to produce a B-stage cured adhesive sheet (a) having slipping velocity of 0.05 µm/sec.

A B-stage cured adhesive sheet (b) having slipping velocity of 0.4 µm/sec was produced by the same manner as described above except that the drying in the hot-air circulating dryer was carried out at 160° C. for 5 minutes.

The resultant B-stage cured adhesive sheets (a) and (b) were superposed so as to oppose each adhesive layer of them, and they were then bonded by passing through a pair of heating rolls heated to 140° C. at roll rate of 1 m/min to produce an adhesive tape (c) having an adhesive layer of 2-layer structure.

After the release film on the adhesive layer having slipping velocity of 0.05 μm/sec was removed from the resultant B-stage cured adhesive tape (c), the adhesive tape was laid on a side of a 100 μm thickness copper sheet, followed by bonding them by passing through a pair of heating rolls heated to 140° C. at roll rate of 1 m/min to produce an adhesive tape having an adhesive layer of 2-layer structure on a side of the copper sheet.

Example 10

The same liquid adhesive as in Example 1 was applied to a surface of a 100 μm thickness copper sheet so as to give dry thickness of 20 μm, and dryed at 180° C. for 5 minutes in a hot-air circulating dryer to produce a B-stage cured adhesive sheet having slipping velocity of 0.05 μm/sec. On this B-stage cured adhesive sheet, the same liquid ahdesive as in Example 1 was coated so as to give dry thickness of 20 μm, followed by drying at 160° C. for 5 minutes to form a B-stage cured adhesive layer having slipping velocity of 0.4 μm/sec, whereby an adhesive tape having an adhesive layer of 2-layer structure on a side of the copper sheet was produced.

Example 11

30 parts by weight of a piperazinylethyl-aminocarbonyl-containing butadiene-acrylonitrile copolymer having weight average molecular weight: 70,000, acrylonitrile content: 25% by weight and amino equivalent: 4,000 (k=55, m=18, n=1), 70 parts by weight of a compound represented by the above mentioned formula (II-1), 1 part by weight of benzoyl peroxide and 2 parts by weight of lauroyl peroxide were added to, mixed with and well dissolved in tetrahydrofuran to obtain a liquid adhesive having a solid content of 40% by weight.

The resultant liquid adhesive was applied to a release film so as to give dry thickness of 20 μm, and dryed at 140° C. for 5 minutes in a hot-air circulating dryer to produce a B-stage cured adhesive sheet (a) having slipping velocity of 0.01 μm/sec.

A liquid adhesive was produced by the same manner as described above except for using 0.05 parts by weight of lauroyl peroxide instead of 2 parts by weight thereof. Using this liquid adhesive, a B-stage cured adhesive sheet (b) having slipping velocity of 0.5 μm/sec was produced by the same manner as described above.

The resultant B-stage cured adhesive sheets (a) and (b) were superposed so as to oppose each adhesive layer of them, and they were bonded to produce an adhesive tape (c) having an adhesive layer of 2-layer structure.

After the release film on the adhesive layer having the slipping velocity of 0.05 μm/sec was removed from the above B-stage cured adhesive tape (c), the adhesive tape was superposed on a surface of a 100 μm thickness copper sheet, and they were bonded to produce an adhesive tape having an adhesive laver of 2-layer structure on a side of the copper sheet.

Example 12

The same liquid adhesive as in Example 11 was applied to a surface of a 100 μm thickness copper sheet so as to give dry thickness of 20 μm, and dryed at 140° C. for 5 minutes to produce a B-stage adhesive sheet having slipping velocity of 0.01 μm/sec.

On this B-stage adhesive sheet was coated a liquid adhesive prepared by the same manner as described above so as to give dry thickness of 20 μm except that the amount of lauroyl peroxide was changed from 2 parts by weight to 0.05 parts by weight, followed by drying at 140° C. for 5 minutes in a hot-air circulating dryer to form a B-stage cured adhesive layer having slipping velocity of 0.5 μ m/sec, by which an adhesive tape having an adhesive layer of 2-layer structure on a side of the copper sheet was produced.

Example 13

A B-stage adhesive sheet (a) having slipping velocity of 0.02 μm/sec, a B-stage adhesive sheet (b) having slipping velocity of 0.3 μm/sec and an adhesive tape (c) having an adhesive layer of 2-layer structure were produced by the same manner as in Example 1.

After the release film on the adhesive layer having slipping velocity of 0.02 μm/sec was removed from the the adhesive tape (c), the adhesive tape was superposed on one side of a 100 μm thickness copper sheet and the B-stage adhesive sheet (a) was superposed on the other side of the copper sheet, followed by bonding them to produce an adhesive tape, wherein one side of the copper sheet was covered with an adhesive layer of 2-layer structure and the other side thereof was covered with an adhesive layer of monolayer structure.

Example 14

A B-stage adhesive sheet (a) having slipping velocity of 0.02 μm/sec, a B-stage adhesive sheet (b) having slipping velocity of 0.3 μm/sec and an adhesive tape (c) having an adhesive layer of 2-layer structure were produced by the same manner as in Example 1.

After the release film on the adhesive layer having slipping velocity of 0.02 μm/sec was removed from the resultant adhesive tape (c), the adhesive tape was superposed on each side of a 100 μm thickness copper sheet, followed by bonding them to produce an adhesive tape wherein both sides of the copper sheet were covered with an adhesive layer of 2-layer structure.

Example 15

An uncured adhesive sheet was produced by applying the same liquid adhesive as in Example 1 was applied to a surface of a release film so as to form an adhesive layer having dry thickness of 20 μm, followed by drying at 120° C. for 5 minutes in a hot-air circulating dryer.

Two of the above mentioned uncured adhesive sheet were prepared, one of which was superposed on a 100 μm thickness copper sheet, follwed by bonding them by passing through a pair of heating rolls heated to 140° C. at roll rate of 1 m/min. The resultant laminate was then pre-cured at 100° C. for 12 hours in a hot-air circulating dryer to produce a B-stage cured adhesive sheet (a) having adhesive layers of slipping velocity of 0.02 μm/sec.

The other uncured adhesive sheet was pre-cured at 70° C. for 12 hours in the hot-air circulating dryer to produce a B-stage cured adhesive sheet (b) having slipping velocity of 0.35 μm/sec.

After the release film was removed from the resultant B-stage cured adhesive sheet (a), the adhesive sheet was superposed on the B-stage cured adhesive sheet (b) so as to oppose each adhesive layer of them, followed by bonding them to produce an adhesive tape wherein one side of the copper sheet was covered with an adhesive layer of 2-layer structure and the other side was covered with an adhesive layer of monolayer structure.

Example 16

A B-stage cured adhesive sheet (a) having slipping velocity of 0.02 μm/sec and a B-stage cured adhesive sheet (b) having slipping velocity of 0.35 μm/sec were produced by the same manner as in Example 15.

After the release film was removed from the B-stage cured adhesive sheet (a), the adhesive sheet (a) was superposed on the B-stage cured adhesive sheet (b) so as to oppose each adhesive layer of them, followed by bonding them to produce an adhesive tape wherein the both sides of the copper sheet were covered with an adhesive layer of 2-layer structure.

Example 17

The same liquid adhesive as in Example 1 was applied to a surface of the release film so as to give dry thickness of 20 μm, and dryed at 180° C. for 5 minutes in a hot-air circulating dryer to produce a B-stage cured adhesive sheet (a) having slipping velocity of 0.05 μ m/sec.

A B-stage cured adhesive sheet (b) having slipping velocity of 0.4 μm/sec was produced by the same manner as described above except that the drying in the hot-air circulating dryer was carried out at 160° C. for 5 minutes.

An adhesive tape (c) having an adhesive layer of 2-layer structure was produced by the same manner as in Example 1.

After the release film on the adhesive layer having slipping velocity of 0.05 μm/sec was removed from the resultant adhesive tape (c), the adhesive tape was laid on one side of a 100 μm thickness copper sheet and the B-stage cured adhesive sheet (a) was laid on the other side of the copper sheet, followed by bonding them to produce an adhesive tape wherein one side of the copper sheet was covered with an adhesive layer of 2-layer structure and the other side was covered with an adhesive layer of monolayer structure.

Example 18

The same liquid adhesive as that of Example 1 was applied to a surface of a release film so as to give dry thickness of 20 μm, and dryed at 180° C. for 5 minutes in a hot-air circulating dryer to produce a B-stage cured adhesive sheet (a) having slipping velocity of 0.05 μ m/sec.

A B-stage cured adhesive sheet (b) having slipping velocity of 0.4 μm/sec was produced by the same manner as described above except that the drying in the hot-air circulating dryer was carried out at 160° C. for 5 minutes.

An adhesive tape (c) having an adhesive layer of 2-layer structure was produced by the same manner as in Example 1.

After the release film on the adhesive tape having slipping velocity of 0.02 μm/sec was removed from the resultant ahdesive tape (c), the adhesive tape was superposed each on each side of a 100 μm thickness copper film, followed by bonding them to produce an adhesive tape wherein the both sides of the copper sheet were covered with an adhesive layer of 2-layer structure.

Example 19

The same liquid adhesive as in Example 1 was applied to each side of a 100 μm thickness copper sheet so as to give dry thickness of 20 μm, followed by drying at 180° C. for 5 minutes in a hot-air circulating dryer to produce a B-stage cured adhesive sheet having slipping velocity of 0.05 μm/sec.

The same liquid adhesive as used in Example 1 was applied to a surface of the resultant B-stage cured adhesive sheet so as to give dry thickness of 20 μm. After a release film was superposed, the laminate was dryed at 160° C. for 5 minutes to form an adhesive layer having slipping velocity of 0.4 μm/sec, whereby an adhesive tape wherein one side of the copper sheet was covered with an adhesive layer of 2-layer structure and the other side was covered with an adhesive layer of monolayer structure was produced.

Example 20

The same liquid adhesive as used in Example 1 was applied to each side of a 100 μm copper sheet so as to give dry thickness of 20 μm, followed by drying at 180° C. for 5 minutes in a hot-air circulating dryer to produce a B-stage cured adhesive sheet having slipping velocity of 0.05 μm/sec.

On each side of the resulted B-stage cured adhesive sheet, the same liquid adhesive as in Example 1 was coated so as to give dry thickness of 20 μm, followed by drying at 160° C. for 5 minutes to form adhesive layers having slipping velocity of 0.4 μm/sec, whereby an adhesive tape wherein the both sides of the copper sheet were covered with an adhesive layer of 2-layer structure was produced.

Example 21

A B-stage cured adhesive sheet (a) having slipping velocity of 0.01 μm/sec, a B-stage cured adhesive sheet (b) having slipping velocity of 0.5 μm/sec, and an adhesive tape (c) having an adhesive layer of 2-layer structure was produced by the same manner as in Example 11.

After the release film on the adhesive layer having slipping velocity of 0.01 μm/sec was removed from the adhesive tape (c), the adhesive tape was laid on one side of a 100 μm thickness copper sheet and a B-stage cured adhesive sheet (a) was laid on the other side of the copper sheet, followed by bonding them to produce an ahdeisve tape wherein one side of the copper sheet was covered with an adhesive layer of 2-layer structure and the other side was covered with an adhesive layer of monolayer structure was produced.

Example 22

A B-stage cured adhesive sheet (a) having slipping velocity of 0.01 μm/sec, a B-stage cured adhesive sheet (b) having slipping velocity of 0.5 μm/sec, and an adhesive tape (c) having an adhesive layer of 2-layer structure was produced by the same manner as in Example 11.

After the release film on the adhesive layer having slipping velocity of 0.01 μm/sec was removed from the adhesive tape (c), the adhesive tape was laid on each side of a 100 μm thickness copper sheet, followed by bonding them to produce an ahdeisve tape wherein the both sides of the copper sheet were covered with an adhesive layer of 2-layer structure.

Example 23

The same liquid adhesive as in Example 11 was applied to each side of a 100 μm thickness of copper sheet so as to give dry thickness of 20 μm, followed by drying at 140° C. for 5 minutes in a hot-air circulating dryer to produce a B-stage cured adhesive sheet having slipping velocity of 0.01 μm/sec.

On a surface of this adhesive sheet was coated a liquid ahdesive procued by the same manner as in example 11 except that the amount of lauroyl peroxide was changed from 2 parts by weight to 0.05 parts by weight. After a release film was superposed, the resultant laminate was dryed at 140° C. for 5 minutes in a hot-air circulating dryer to form an adhesive layer having slipping velocity of 0.5 μm/sec, whereby an ahdeisve tape wherein one side of the copper sheet was covered with an adhesive layer of 2-layer structure and the other side was covered with an adhesive layer of monolayer structure was produced.

Example 24

The same liquid adhesive as that in Example 11 was applied to each side of a 100 μm thickness copper sheet so as to give dry thickness of 20 μm, followed by drying at 140° C. for 5 minutes in a hot-air circulating dryer to produce a B-stage cured adhesive sheet having slipping velocity of 0.01 μm/sec.

Both sides of this adhesive sheet were coated with a liquid ahdesive procued by the same manner as in example 11 except that the amount of lauroyl peroxide was changed from 2 parts by weight to 0.05 parts by weight. After a release film was superposed on each adhesive layer, the resultant laminate was dryed at 140° C. for 5 minutes in a hot-air circulating dryer to form an adhesive layer having slipping velocity of 0.5 μm/sec, whereby an ahdeisve tape wherein the both sides of the copper sheet were covered with an adhesive layer of 2-layer structure was produced.

Example 25

70 parts by weight of a piperazinylethylamino-carbonyl-containing butadiene-acrylonitrile copolymer having weight average molecular weight: 70,000, acrylonitrile content: 25% by weight and amino equivalent: 4,000 (k=55, m=18, n=1), 30 parts by weight of a compound represented by the above mentioned formula (II-1), and 1 part by weight of benzoyl peroxide were added to, mixed with and well dissolved in tetrahydrofuran to obtain a liquid adhesive having solid content of 40% by weight. This liquid adhesive was coated to dry thickness of 20 μm on a surface of a release film, followed by drying at 120° C. for 5 minutes in a hot-air circulating dryer to produce an uncured adhesive sheet.

Two of the above described uncured adhesive sheet were prepared, one of which was pre-cured at 100° C. for 12 hours in the hot-air circulating dryer to produce a B-stage cured adhesive sheet (a) having slipping velocity of 0.05 μm/sec.

The other uncured adhesive sheet was precured at 70° C. for 12 hours in the hot-air circulating dryer to produce a B-stage cured adhesive sheet (b) having slipping velocity of 0.35 μm/sec.

The above mentioned B-stage cured adhesive sheets (a) and (b) were superposed so as to oppose each adhesive layer of them, and they were bonded by passing through a pair of heating rolls heated to 140° C. at roll rate of 1 m/min to produce an adhesive tape (c) having an adhesive layer of 2-layer structure.

Thereafter, the release film on the adhesive layer having slipping velocity of 0.05 μm/sec was removed from the adhesive tape (c). This adhesive tape was laid on a surface of a 100 μm thickness copper sheet, followed by bonding them by passing through a pair of heating rolls heated to 140° C. at roll rate of 1 m/min to produce an adhesive tape having an adhesive layer of 2-layer structure on a side of the copper sheet.

Example 26

An uncured adhesive sheet was produced by applying the liquid adhesive used in Example 25 to a surface of a release film so as to give a dry thickness of 20 μm and drying at 120° C. for 5 minutes in the hot-air circulating dryer.

Two of the above uncured adhesive sheet were prepared, one of which was superposed on a 100 μm thickness copper sheet, follwed by bonding them by passing through a pair of heating rolls heated to 140° C. at roll rate of 1 m/min and pre-curing at 100° C. for 12 hours in the hot-air circulating dryer to produce a B-stage cured adhesive sheet (a) having slipping velocity of 0.05 μm/sec.

The other uncured adhesive sheet was pre-cured at 70° C. for 12 hours in the hot-air circulating dryer to produce a B-stage cured adhesive sheet (b) having sliding rate of 0.35 μm/sec.

After the release film was removed from the resultant B-stage cured adhesive sheet (a), the adhesive sheet was superposed on the B-stage cured adhesive sheets (b) so as to oppose each adhesive layer of them, followed by bonding them to produce an adhesive tape having an adhesive layer of 2-layer structure on one side of the copper sheet.

Example 27

The liquid adhesive used in Example 1 was applied to a surface of a release film so as to give a dry thickness of 20 μm, followed by drying at 180° C. for 5 minutes to produce a B-stage cured adhesive sheet (a) having slipping velocity of 0.1 μm/sec.

A B-stage adhesive sheet (b) having slipping velocity of 0.6 μm/sec was produced by the same manner as described above except that the drying in the hot-air circulating dryer was carried out at 160° C. for 5 minutes.

The resultant B-stage cured adhesive sheets (a) and (b) were bonded by superposing so as to oppose each adhesive layer of them, whereby an adhesive tape (c) having an adhesive layer of 2-layer structure was produced. The release film on the adhesive layer having slipping velocity of 0.1 μm/sec was removed from the resultant adhesive tape (c) and the adesive tape was then superposed on a surface of a 100° C. thickness copper sheet and bonded to produce an adhesive tape having an adhesive layer of 2-layer structure on a side of the copper sheet.

Example 28

The same liquid adhesive as that of Example 25 was applied to a surface of a 100 μm thickness copper sheet and dried at 180° C. for 5 minutes in a hot-air circulating dryer to produce a B-stage cured adhesive sheet having slipping velocity of 0.1 μm/sec. On the resultant B-stage cured adhesive sheet was coated the same liquid adhesive as in Example 25 so as to give dry thickness of 20 μm, followed by drying at 160° C. for 5 minutes in a hot-air circulating dryer to form a B-stage cured adhesive layer having slipping velocity of 0.6 μm/sec, whereby an adhesive tape having an adhesive layer of 2-layer structure on a side of the copper sheet was produced.

Example 29

30 parts by weight of a piperazinylethylamino-carbonyl-containing butadiene-acrylonitrile copolymer having weight average molecular weight: 70,000, acrylonitrile content: 25% by weight and amino equivalent: 4,000 ($k=55$, $m=18$, $n=1$), 61 parts by weight of a compound represented by the above mentioned formula (II-1), 9 parts by weight of 1,3-bis(3-aminopropyl)-1,1,3,3-tetramethyldisiloxane (molar equivalent of maleimide group of the above mentioned compound per molar equivalent of amino group: 1.46) and 1 part by weight of benzoyl peroxide were added to, mixed with and well dissolved in tetrahydrofuran to obtain a liquid adhesive having a solid content of 40% by weight. This liquid adhesive was coated to dry thickness of 20 μm on a surface of a release film, and dryed at 120° C. for 5 minutes in a hot-air circulating dryer to produce an uncured adhesive sheet.

Two of the above described uncured adhesive sheet were prepared, one of which was pre-cured at 100° C. for 12 hours in the hot-air circulating dryer to produce a B-stage cured adhesive sheet (a) having slipping velocity of 0.02 μ m/sec.

The other uncured adhesive sheet was pre-cured at 70° C. for 12 hours in the hot-air circulating dryer to produce a B-stage cured adhesive sheet (b) having slipping velocity of 0.35 μm/sec.

The above mentioned B-stage cured adhesive sheets (a) and (b) were superposed so as to oppose each adhesive layer of them, and they were bonded by passing through a pair of heating rolls heated to 140° C. at roll rate of 1 m/min to produce an adhesive tape (c) having an adhesive layer of 2-layer structure.

Thereafter, the release film on the adhesive layer having slipping velocity of 0.02 μm/sec was removed from the adhesive tape (c). This adhesive tape was laid on a surface of a 100 μm thickness copper sheet, followed by bonding them by passing through a pair of heating rolls heated to 140° C. at roll rate of 1 m/min to produce an adhesive tape having an adhesive layer of 2-layer structure on a side of the copper sheet.

Example 30

30 parts by weight of a piperazinylethylamino-carbonyl-containing butadiene-acrylonitrile copolymer having weight average molecular weight: 70,000, acrylonitrile content: 25% by weight and amino equivalent: 4,000 ($k=55$, $m=18$, $n=1$), 61 parts by weight of a compound represented by the above mentioned formula (II-1), 9 parts by weight of 1,3-bis (3-aminopropyl)-1,1,3,3-tetramethyldisiloxane (molar equivalent of maleimide group of the above mentioned compound per molar equivalent of amino group: 1.46) 1 part by weight of benzoyl peroxide and 2 parts by weight of lauroyl peroxide were added to, mixed with and well dissolved in tetrahydrofuran to obtain a liquid adhesive having a solid content of 40% by weight.

This liquid adhesive was coated to dry thickness of 20 μm on a surface of a release film, and dryed at 140° C. for 5 minutes in a hot-air circulating dryer to produce a B-stage cured adhesive sheet (a) having slipping velocity of 0.02 μm/sec.

A B-stage adhesive sheet (b) having slipping velocity of 0.55 μm/sec was produced by the same manner as described above except that the amount of lauroyl peroxide was changed from 2 parts by weight to 0.05 parts by weight.

The above mentioned B-stage cured adhesive sheets (a) and (b) were superposed so as to oppose each adhesive layer of them and bonded to produce an adhesive tape (c) having an adhesive layer of 2-layer structure.

Thereafter, the adhesive tape (c) from which the release film on the adhesive layer having slipping velocity of 0.02 μm/sec was removed was laid on a surface of a 100 μm thickness copper sheet, follow by bonding them to produce an adhesive tape having an adhesive layer of 2-layer structure on a side of the copper sheet.

Example 31

30 parts by weight of a piperazinylethylamino-carbonyl-containing butadiene-acrylonitrile copolymer having weight average molecular weight: 70,000, acrylonitrile content: 25% by weight and amino equivalent: 4,000 ($k=55$, $m=18$, $n=1$), 68 parts by weight of a compound represented by the above mentioned formula (II-1), 2 parts by weight of hexamethylenediamine (molar equivalent of maleimide group of the above mentioned compound per molar equivalent of amino group:3.00) 1 part by weight of benzoyl peroxide and 2 parts by weight of lauroyl peroxide were added to, mixed with and well dissolved in tetrahydrofuran to obtain a liquid adhesive having a solid content of 40% by weight.

This liquid adhesive was coated to a dry thickness of 20 μm on both sides of a 100 μm thickness copper sheet and dryed at 140° C. for 5 minutes in a hot-air circulating dryer to produce a B-stage cured adhesive sheet having slipping velocity of 0.15 μm/sec.

A liquid adhesive prepared by the same manner as described above except that the amount of lauroyl peroxide was changed from 2 parts by weight to 0.05 parts by weight was applied to one side of the resultant adhesive sheet. After a release film was laid on the coated liquid adhesive layer, the laminate was dryed at 140° C. for 5 minutes to form a B-stage cured adhesive layer having slipping velocity of 2.00 μm/sec, whereby an adhesive tape wherein one side of the copper sheet was covered with an adhesive layer of 2-layer structure and the other side was covered with an adhesive layer of monolayer structure was produced.

Example 32

30 parts by weight of a piperazinylethylamino-carbonyl-containing butadiene-acrylonitrile copolymer having weight average molecular weight: 70,000, acrylonitrile content: 25% by weight and amino equivalent: 4,000 ($k=55$, $m=18$, $n=1$), 68 parts by weight of a compound represented by the above mentioned formula (II-1), 2 parts by weight of hexamethylenediamine (molar equivalent of maleimide group of the above mentioned compound per molar equivalent of amino group:3.00) and 1 part by weight of benzoyl peroxideswere added to, mixed with and well dissolved in tetrahydrofuran to obtain a liquid adhesive having a solid content of 40% by weight.

The resultant liquid adhesive was applied to a surface of a release film so as to give dry thickness of 20 μm and dryed at 120° C. for 5 minutes in a hot-air circulating dryer to produce an uncured adhesive sheet.

Two of the above uncured adhesive sheet were prepared, one of which was pre-cured at 100° C. for 12 hours in a hot-air circulating dryer to produce a B-stage cured adhesive sheet (a) having slipping velocity of 0.1 μm/sec.

The other uncured adhesive sheet was pre-cured at 70° C. for 12 hours in the hot-air circulating dryer to produce a B-stage cured adhesive sheet (b) having slipping velocity of 1.5 μm/sec.

The resultant B-stage cured adhesive sheets (a) and (b) were superposed so as to oppose each adhesive layer of them, followed by bonding them to produce an adhesive tape (c) having an adhesive layer of 2-layer structure.

After the release film on the adhesive layer having the slipping velocity of 0.1 μm/sec was removed from the B-stage cured adhesive tape (c), the adhesive tape was superposed on a surface of a 100 μm thickness copper sheet, followed by bonding them to produce an adhesive tape having an adhesive layer of 2-layer structure on a side of the copper sheet.

Example 33

An uncured adhesive sheet was produced by coating a surface of a release film with the same liquid adhesive as that of Example 32 so as to give dry thickness of 20 μm.

Two of the above uncured adhesive sheet were prepared, one of which was pre-cured at 100° C. for 12 hours in a hot-air circulating dryer to produce a B-stage cured adhesive sheet (a) having slipping velocity of 0.2 μm/sec.

The other uncured adhesive sheet was pre-cured at 70° C. for 12 hours in the hot-air circulating dryer to produce a B-stage cured adhesive sheet (b) having slipping velocity of 2.35 μm/sec.

The resultant B-stage cured adhesive sheets (a) and (b) were bonded by superposing so as to oppose each adhesive layer of them, whereby an adhesive tape (c) having an adhesive layer of 2-layer structure was produced.

Thereafter, the release film on the adhesive layer having the slipping velocity of 0.2 μm/sec was removed from the B-stage cured adhesive tape (c). This adhesive tapes was superposed on one side of a 100 μm thickness copper sheet, and the B-stage cured adhesive sheet (a) was superposed on the other side of the copper sheet, followed by bonding them to produce an adhesive tape wherein one side of the copper sheet was covered with an adhesive layer of 2-layer structure and the other side was covered with an adhesive layer of monolayer structure.

Example 34

30 parts by weight of a piperazinylethylamino-carbonyl-containing butadiene-acrylonitrile copolymer having weight average molecular weight: 70,000, acrylonitrile content: 25% by weight and amino equivalent: 4,000 (k=55, m=18, n=1), 61 parts by weight of a compound represented by the above mentioned formula (II-2), 9 parts by weight of 1,3-bis(3-aminopropyl)-1,1,3,3-tetramethyldisiloxane (molar equivalent of maleimide group of the above mentioned compound per molar equivalent of amino group: 2.33) and 1 part by weight of benzoyl peroxide were added to, mixed with and well dissolved in tetrahydrofuran to obtain a liquid adhesive having a solid content of 40% by weight.

This liquid adhesive was coated to a dry thickness of 20 μm on a surface of a release film, and dryed at 180° C. for 5 minutes in a hot-air circulating dryer to produce a B-stage cured adhesive sheet (a) having slipping velocity of 0.01 μm/sec.

A B-stage cured adhesive sheet (b) having slipping velocity of 0.20 μm/sec was produced by the same manner as described above except that the drying in the hot-air circulating dryer was carried out at 160° C. for 5 minutes.

The B-stage cured adhesive sheets (a) and (b) were superposed so as to oppose each adhesive layer of them, followed by bonding them to produce an adhesive tape (c) having an adhesive layer of 2-layer structure.

After the release film on the adhesive layer having slipping velocity of 0.01 μm/sec was removed from the adhesive tape (c), the adhesive tape was laid on one side of a 100 μm thickness copper sheet and the B-stage cured adhesive sheet (a) was laid on the other side of the copper sheet, followed by bonding them to produce an adhesive tape wherein one side of the copper sheet was covered with an adhesive layer of 2-layer structure and the other side was covered with an adhesive layer of monolayer structure.

Example 35

The same liquid adhesive as in Example 34 was applied to each side of a 100 μm thickness copper sheet so as to give a dry thickness of 20 μm, followed by drying at 180° C. for 5 minutes in a hot-air circulating dryer to produce a B-stage cured adhesive sheet having slipping velocity of 0.01 μm/sec. To one side of the resultant B-stage cured adhesive sheet, the same liquid adhesive as that of Example 34 was applied so as to give a dry thickness of 20 μm, followed by laying a release film thereon and drying at 160° C. for 5 minutes to form a B-stage cured adhesive layer having slipping velocity of 0.25 μm/sec, whereby an adhesive tape wherein one side of the copper sheet was covered with an adhesive layer of 2-layer structure and the other side was covered with an adhesive layer of monolayer structure.

Example 36

30 parts by weight of a piperazinylethylamino-carbonyl-containing butadiene-acrylonitrile copolymer having weight average molecular weight: 70,000, acrylonitrile content: 25% by weight and amino equivalent:4,000 (k=55, m=18, n=1), 61 parts by weight of a compound represented by the above mentioned formula (II-2), 9 parts by weight of 1,3-bis(3-aminopropyl)-1,1,3,3-tetramethyldisiloxane (molar equivalent of maleimide group of the above mentioned compound per molar equivalent of amino group:2.33), 1 part by weight of benzoyl peroxide and 2 parts by weight of lauroyl peroxide were added to, mixed with and well dissolved in tetrahydrofuran to obtain a liquid adhesive having a solid content of 40% by weight.

This liquid adhesive was coated to a dry thickness of 20 μm on a surface of a release film, and dryed at 140° C. for 5 minutes in a hot-air circulating dryer to produce a B-stage cured adhesive sheet (a) having slipping velocity of 0.01 μm/sec.

A B-stage cured adhesive sheet (b) having slipping velocity of 0.2 μm/sec was produced by the same manner as described above except that the amount of lauroyl peroxide was changed from 2 parts by weight to 0.05 parts by weight.

The B-stage cured adhesive sheets (a) and (b) were superposed so as to oppose each adhesive layer of them and bonded to produce an adhesive tape (c) having an adhesive layer of 2-layer structure.

After the release film on the adhesive layer having slipping velocity of 0.01 μm/sec was removed from the adhesive tape (c), the adhesive tape was laid on one side of a 100 μm thickness copper sheet and the B-stage cured adhesive sheet (a) was laid on the other side of the copper sheet, followed by bonding them to produce an adhesive tape having an adhesive layer of 2-layer structure on a side of the copper sheet and an adhesive layer of monolayer structure on the other side of the copper sheet.

Example 37

30 parts by weight of a piperazinylethylamino-carbonyl-containing butadiene-acrylonitrile copolymer having weight average molecular weight: 70,000, acrylonitrile content: 25% by weight and amino equivalent:4,000 (k=55, m=18, n=1), 61 parts by weight of a compound represented by the above mentioned formula (II-1), 9 parts by weight of 1,3-bis(3-aminopropyl)-1,1,3,3-tetramethyldisiloxane (molar equivalent of maleimide group of the above mentioned compound per molar equivalent of amino group:1.46) and 1 part by weight of benzoyl peroxide were added to, mixed with and well dissolved in tetrahydrofuran to obtain a liquid mixture having a solid content of 40% by weight. To the resultant liquid mixture, 10 parts by weight of an alumina filler (produced by showa denko K.K.) were added to produce a liquid adhesive.

This liquid adhesive was coated to a dry thickness of 20 μm on a surface of a release film to produce an uncured adhesive sheet.

Two of the uncured adhesive sheet were prepared, one of which was pre-cured at 100° C. for 12 hours to produce a B-stage cured adhesive sheet (a) having slipping velocity of 0.02 μm/sec.

A B-stage cured adhesive sheet (b) having slipping velocity of 0.35 μm/sec was produced by pre-curing at 70° C. for 12 hours in a hot-air circulating dryer.

The resultant B-stage cured adhesive sheets (a) and (b) were bonded by superposing so as to oppose each adhesive layer of them, whereby an adhesive tape (c) having an adhesive layer of 2-layer structure was produced.

After the release film on the adhesive layer having slipping velocity of 0.02 μm/sec was removed from the adhesive tape (c), the adhesive tape was laid on a surface of a 100 μm thickness copper sheet, followed by bonding them to produce an adhesive tape having an adhesive layer of 2-layer structure on a side of the copper sheet.

Example 38

The same liquid adhesive as used in Example 37 was applied to a surface of the release film so as to give a dry thickness of 20 μm, followed by drying at 180° C. for 5 minutes in a hot-air circulating dryer to produce a B-stage cured adhesive sheet (a) having slipping velocity of 0.04 H m/sec.

A B-stage cured adhesive sheet (b) having slipping velocity of 0.45 μm/sec was produced by the same manner as described above except that the drying in the hot-air circulating dryer was carried out at 160° C. for 5 minutes.

The resultant B-stage cured adhesive sheets (a) and (b) were bonded by superposing so as to oppose each adhesive layer of them, whereby an adhesive tape (c) having an adhesive layer of 2-layer structure was produced.

After the release film on the adhesive layer having slipping velocity of 0.04 μm/sec was removed from the adhesive tape (c), the adhesive tape was laid on a surface of a 100 μm thickness copper sheet, followed by bonding them to produce an adhesive tape having an adhesive layer of 2-layer structure on a side of the copper sheet.

Example 39

The same liquid adhesive as used in Example 37 was applied to a surface of a 100 μm thickness copper sheet so as to give a dry thickness of 20 μm and dryed at 180° C. for 5 minutes in a hot-air circulating dryer to produce a B-stage cured adhesive sheet having slipping velocity of 0.04 μm/sec. On the resultant B-stage cured adhesive sheet, the same liquid adhesive as used in Example 37 was coated so as to give dry thickness of 20 μm and dryed at 160° C. for 5 minutes to form a B-stage cured ahdesive layer having slipping velocity of 0.45 μm/sec, whereby an adhesive tape having an adhesive layer of 2-layer structure on a side of the copper sheet was produced.

Example 40

30 parts by weight of a piperazinylethylamino-carbonyl-containing butadiene-acrylonitrile copolymer having weight average molecular weight: 70,000, acrylonitrile content: 25% by weight and amino equivalent: 4,000 (k=55, mm=18, n=1), 61 parts by weight of a compound represented by the above mentioned formula (II-1), 9 parts by weight of 1,3-bis(3-aminopropyl)-1,1,3,3-tetramethyldisiloxane (molar equivalent of maleimide group of the above mentioned compound per molar equivalent of amino group:1.46), 1 part by weight of benzoyl peroxide and 2 parts by weight of lauroyl peroxide were added to, mixed with and well dissolved in tetrahydrofuran to obtain a liquid mixture having a solid content of 40% by weight. To the resultant liquid mixture, 10 parts by weight of an alumina filler (produced by showa denko K.K.) were added to produce a liquid adhesive.

The resultant liquid adhesive was applied to a surface of a release film so as to give a dry thickness of 20 μm and dryed at 140° C. for 5 minutes in a hot-air circulating dryer to produce a B-stage cured adhesive sheet (a) having slipping velocity of 0.02 μm/sec.

A B-stage cured adhesive sheet (b) having slipping velocity of 0.55 μm/sec was produced by the same manner as described above except that the amount of lauroyl peroxide was changed from 2 parts by weight to 0.05 parts by weight.

The resultant B-stage cured adhesive sheets (a) and (b) were superposed so as to oppose each adhesive layer of them, and they were bonded by passing through a pair of heating rolls heated to 140° C. at roll rate of 1 m/min to produce an adhesive tape (c) having an adhesive layer of 2-layer structure.

After the release film on the adhesive layer having slipping velocity of 0.02 μm/sec was removed from the adhesive tape (c), the adhesive tape was laid on a side of a 100 μm thickness copper sheet, followed by bonding them to produce an adhesive tape having an adhesive layer of 2-layer structure on a side of the copper sheet.

Example 41

The same liquid adhesive as that in Example 40 was applied to a surface of a 100 μm thickness copper sheet so as to give a dry thickness of 20 μm and dryed at 140° C. for 5 minutes in a hot-air circulating dryer to produce a B-stage cured adhesive sheet having slipping velocity of 0.02 μm/sec.

On the resultant B-stage cured adhesive sheet, the same liquid adhesive as described above except that the amount of lauroyl peroxide was changed from 2 parts by weight to 0.05 parts by weight was coated so as to give a dry thickness of 20 μm and dryed at 140° C. for 5 minutes to form a B-stage cured ahdesive layer having slipping velocity of 0.55 μm/sec, whereby an adhesive tape having an adhesive layer of 2-layer structure on a side of the copper sheet was produced.

Example 42

A B-stage cured adhesive sheet (a) having slipping velocity of 0.02 μm/sec, a B-stage cured adhesive sheet (b) having slipping velocity of 0.35 μm/sec, and an adhesive tape (c) having an adhesive layer of 2-layer structure were produced by the same procedure as in Example 37.

The resultant adhesive tape (c) from which the releasing film on the adhesive layer having slipping velocity of 0.02 μm/sec was removed was laid on one side of a 100 μm thickness copper sheet, and the B-stage adhesive sheet (a) was laid on the other side of the copper sheet, followed by bonding them to produce an adhesive tape having adhesive layer of 2-layer structure on one side of the copper sheet and an adhesive layer of monolayer structure on the other side of the copper sheet.

Example 43

The same liquid adhesive as used in Example 37 was applied to a surface of the release film so as to give a dry thickness of 20 μm and dryed at 180° C. for 5 minutes in a hot-air circulating dryer to produce a B-stage cured adhesive sheet (a) having slipping velocity of 0.04 μ m/sec.

A B-stage cured adhesive sheet (b) having slipping velocity of 0.45 μm/sec was produced by the same manner as described above except that the drying in the hot-air circulating dryer was carried out at 160° C. for 5 minutes.

An adhesive tape (c) having an adhesive layer of 2-layer structure was produced using the resultant B-stage cured adhesive sheets by the same manner as in Example 37.

After the release film on the adhesive layer having slipping velocity of 0.04 μm/sec was removed from the adhesive tape (c), the adhesive tape was laid on one side of a 100 μm thickness copper sheet, and the B-stage cured adhesive sheet (a) was laid on the other side of the copper sheet, followed by bonding them to produce an adhesive tape wherein one side of the copper sheet was covered with an adhesive layer of 2-layer structure and the other side was covered with an adhesive layer of monolayer structure.

Example 44

The same liquid adhesive as used in Example 37 was applied to each side of a 100 μm copper sheet so as to give dry thickness of 20 μm and dryed at 180° C. for 5 minutes in a hot-air circulating dryer to produce a B-stage cured adhesive sheet having adhesive layers of slipping velocity: 0.04 μm/sec.

The same liquid ahdesive as that used in Example 14 was applied to one side of the resultant B-stage cured adhesive sheet so as to give a dry thickness of 20 μm. After a release film was laid on the coated liquid adhesive layer, the laminate was dryed at 160° C. for 5 minutes to form an adhesive layer having slipping velocity of 0.45 μ m/sec, whereby an adhesive tape wherein one side of the copper sheet was covered with an adhesive layer of 2-layer structure and the other side was covered with an adhesive layer of monolayer structure was produced.

Example 45

A B-stage cured adhesive sheet (a) having slipping velocity of 0.02 μm/sec, a B-stage cured adhesive sheet (b) having slipping velocity of 0.55 μm/sec, and an adhesive tape (c) having an adhesive layer of 2-layer structure were produced by the same procedure as in Example 40.

After the release film on the adhesive layer having slipping velocity of 0.02 μm/sec and removed from the resultant adhesive tape (c), the adhesive tape was laid on one side of a 100 μm thickness copper sheet, and the B-stage adhesive sheet (a) was laid on the other side of the copper sheet, followed by bonding them to produce an adhesive tape wherein one side of the copper sheet was covered with an adhesive layer of 2-layer structure and the other side was covered with an adhesive layer of monolayer structure.

Example 46

30 parts by weight of a piperazinylethylamino-carbonyl-containing butadiene-acrylonitrile copolymer having weight average molecular weight: 20,000, acrylonitrile content: 20% by weight and amino equivalent: 4,000 ($k=58.4$, $m=14.6$, $n=1$), 61 parts by weight of a compound represented by the above mentioned formula (II-1), 9 parts by weight of 1,3-bis(3-aminopropyl)-1,1,3,3-tetramethyldisiloxane (molar equivalent of maleimide group of the above mentioned compound per molar equivalent of amino group:1.46) and 1 part by weight of benzoyl peroxide were added to, mixed with and well dissolved in tetrahydrofuran to obtain a liquid adhesive having a solid content of 40% by weight.

This liquid adhesive was coated to a dry thickness of 20 μm on a surface of a release film to produce an uncured adhesive sheet.

Two of the above uncured adhesive sheet were prepared, one of which was pre-cured at 100° C. for 12 hours in a hot-air circulating dryer to produce a B-stage cured adhesive sheet (a) having slipping velocity of 0.02 μ m/sec.

The other uncured adhesive sheet was pre-cured at 70° C. for 12 hours in the hot-air circulating dryer to produce a B-stage cured adhesive sheet (b) having sliding rate of 0.35 μm/sec.

The resultand B-stage cured adhesive sheets (a) and (b) were superposed so as to oppose each adhesive layer of them, followed by bonding them to produce an adhesive tape (c) having an adhesive layer of 2-layer structure.

After the release film on the adhesive layer having slipping velocity of 0.02 μm/sec was removed from the B-stage cured adhesive tape (c), the adhesive tape was superposed on a surface of a 50 μm thickness copper sheet, followed by bonding them to produce an adhesive tape having an adhesive layer of 2-layer structure on a side of the copper sheet.

Example 47

The same liquid adhesive as used in Example 46 was applied to a surface of the release film so as to give a dry thickness of 20 μm and dryed at 180° C. for 5 minutes in a hot-air circulating dryer to produce a B-stage cured adhesive sheet having adhesive layer of slipping velocity of 0.04 μm/sec.

A B-stage cured adhesive sheet (b) having slipping velocity of 0.45 μm/sec was produced by the same manner as described above except that the drying in the hot-air circulating dryer was carried out at 160° C. for 5 minutes.

The resultant B-stage cured adhesive sheets (a) and (b) were superposed so as to oppose each adhesive layer of them, followed by bonding them to produce an adhesive tape (c) having an adhesive layer of 2-layer structure.

After the release film on the adhesive layer having slipping velocity of 0.04 μm/sec was removed from the Bstage cured adhesive tape (c), the adhesive tape was superposed on a surface of a 100 μm thickness copper sheet, followed by bonding them to produce an adhesive tape having an adhesive layer of 2-layer structure on a side of the copper sheet.

Example 48

The same liquid adhesive as used in Example 46 was applied to a surface of a 100 μm copper sheet so as to give a dry thickness of 20 μm and dryed at 180° C. for 5 minutes in a hot-air circulating dryer to produce a B-stage cured adhesive sheet having an adhesive layer of slipping velocity of 0.04 μm/sec.

A surface of the resultant B-stage cured adhesive sheet was coated with the same liquid adhesive as that used in Example 14 so as to give a dry thickness of 20 μm, followed by drying at 160° C. for 5 minutes to form an adhesive layer having slipping velocity of 0.45 μm/sec, whereby an adhesive tape having an adhesive layer of 2-layer structure on a side of the copper sheet was produced.

Example 49

30 parts by weight of a piperazinylethylamino-carbonyl-containing butadiene-acrylonitrile copolymer having weight average molecular weight: 150,000, acrylonitrile content: 20% by weight and amino equivalent: 4,000 (k=58.4, m=14.6, n=1), 61 parts by weight of a compound represented by the above mentioned formula (II-1), 9 parts by weight of 1,3-bis(3-aminopropyl)-1,1,3,3-tetramethyldisiloxane (molar equivalent of maleimide group of the above mentioned compound per molar equivalent of amino group:1.46) and 1 part by weight of benzoyl peroxide were added to, mixed with and well dissolved in tetrahydrofuran to obtain a liquid adhesive having a solid content of 40% by weight.

This liquid adhesive was coated to a dry thickness of 20 μm on a surface of a release film to produce an uncured adhesive sheet.

Two of the uncured adhesive sheet were prepared, one of which was pre-cured at 100° C. for 12 hours in a hotair circulating dryer to produce a B-stage cured adhesive sheet (a) having slipping velocity of 0.02 μm/sec.

The other uncured adhesive sheet was pre-cured at 70° C. for 12 hours in the hot-air circulating dryer to produce a B-stage cured adhesive sheet (b) having slipping velocity of 0.35 μm/sec.

The resultant B-stage cured adhesive sheets (a) and (b) were superposed so as to oppose each adhesive layer of them, followed by bonding them to produce an adhesive tape (c) having an adhesive layer of 2-layer structure.

After the release film on the adhesive layer having slipping velocity of 0.02 μm/sec was removed from the B-stage cured adhesive tape (c), the adhesive tape was superposed on a surface of a 50 μm thickness copper sheet, followed by bonding them to produce an adhesive tape having an adhesive layer of 2-layer structure on a side of the copper sheet.

Example 50

The same liquid adhesive as used in Example 49 was applied to a surface of a release film and dryed at 180° C. for 5 minutes in a hot-air circulating dryer to produce a B-stage cured adhesive sheet (a) having slipping velocity of 0.04 μm/sec.

A B-stage cured adhesive sheet (b) having slipping velocity of 0.45 μm/sec was produced by the same manner as described above except that the drying in the hot-air circulating dryer was carried out at 160° C. for 5 minutes.

The B-stage cured adhesive sheets (a) and (b) were bonded by superposing so as to face the adhesive layer of them each other to produce an adhesive tape (c) having an adhesive layer of 2-layer structure.

After the release film on the adhesive layer having slipping velocity of 0.04 μm/sec was removed from the Bstage cured adhesive tape (c), the adhesive tape was laid on a surface of a 100 μm thickness copper sheet, followed by bonding them to produce an adhesive tape having an adhesive layer of 2-layer structure on a side of the copper sheet.

Example 51

The liquid adhesive used in Example 49 was applied to a surface of a 100 μm copper sheet so as to give a dry thickness of 20 μm and dryed at 180° C. for 5 minutes in a hot-air circulating dryer to produce a B-stage cured adhesive sheet having slipping velocity of 0.04 μm/sec.

To this B-stage cured adhesive tape, the liquid adhesive used in Example 14 was applied so as to give dry thickness of 20 μm and dryed at 160° C. for 5 minutes to form a B-stage cured adhesive layer having slipping velocity of 0.45 μm/sec, whereby an adhesive tape having an adhesive layer of 2-layer structure on a side of the copper sheet was produced.

Comparative Example 1

A nylon-epoxy adhesive (TORESINE FS-410, produced by Teikoku Kagaku Sangyo K.K.) (solid content: 20%; solvent isopropyl alcohol:methyl ethyl ketone=2:1) was prepared.

The resultant adhesive was applied to a surface of a 38 μm thickness polyethylene terephthalate film which was subjected to release treatment to give a dry thickness of 40 μm, followed by drying at 150° C. for 15 minutes in a hot-air circulating dryer to produce an adhesive tape having a B-stage cured adhesive layer.

Thereafter, the adhesive tape was superposed on a surface of a 100 μm thickness copper sheet, followed by bonding them by passing through a pair of heating rolls heated to 140° C. at roll rate of 1 m/min to produce an adhesive tape having an adhesive layer of monolayer structure on a side of the copper sheet.

Comparative Example 2

A 20% by weight solution of polyimide varnish (Lark TPI, produced by MITUI TOATSU CHEMICALS INC.) in N-methylpyrolidone was prepared.

This adhesive was applied to a surface of a 38 μm thickness polyethylene terephthalate film which was subjected to release treatment to give a dry thickness of 40 μm, followed by drying at 150° C. for 120 minutes in a hot-air circulating cryer and then at 250° C. for 60 minutes in a hot-air circulating dryer to produce an adhesive sheet having a B-stage cured adhesive layer.

Thereafter, the adhesive tape was superposed on a surface of a 100 μm thickness copper sheet, followed by bonding them by passing through a pair of heating rolls heated to 350° C. at roll rate of 1 m/min to produce an adhesive tape having an adhesive layer of monolayer structure on a side of the copper sheet.

Comparative Example 3

The same liquid adhesive as that in Example 1 was applied to a surface of the same release film as in Example 1 to give a dry thickness of 40 μm, followed by drying at 120° C. for 5 minutes and then pre-curing at 100° C. for 12 hours in a hot-air circulating dryer, to produce an adhesive sheet having a B-stage cured adhesive layer having a slipping velocity of 0.02 μm/sec which was composed of only one semi-cured layer having a high status of semicure.

Thereafter, the adhesive tape was superposed on a surface of a 100 μm thickness copper sheet, followed by bonding them by passing through a pair of heating rolls heated to 140° C. at roll rate of 1 m/min to produce an adhesive tape having an adhesive layer of monolayer structure on a side of the copper sheet.

Comparative Example 4

The same liquid adhesive as that in Example 1 was applied to a surface of the same release film as in Example 1 to give a dry thickness of 40 μm, followed by drying at 120° C. for 5 minutes in a hot-air circulating dryer and then precuring at 70° C. for 12 hours in a hot-air circulating dryer to produce an adhesive sheet having a B-stage cured adhesive layer having a slipping velocity of 0.3 μm/sec which was composed of only one semi-cured layer having a low status of semi-cure.

Thereafter, the adhesive tape was superposed on a surface of a 100 μm thickness copper sheet, followed by bonding them by passing through a pair of heating rolls heated to 140° C. at roll rate of 1 m/min to produce an adhesive tape having an adhesive layer of monolayer structure on a side of the copper sheet.

Assembling of Leadframe

The leadframe used in a semiconductor package as shown in FIG. 1 was assembled according to the following procedures. (a) Punch Die of Adhesive Tape The adhesive tape was subjected to punch dying by mold. (b) Assembling of Leadframe The adhesive tape obtained in the above process was laid on the predeterminated position of the leadframe and pressed with heat on a hot plate heated at 120° C. to adhere the adhesive tape to the leadframe. (c) Curing of Adhesive Tape In a hot-air circulating oven whose atmosphere was substituted by nitrogen, the adhesive tape was cured on the leadframe assembled in the above three stages under the conditions described in Table 1.

TABLE 1

| Adhesive tape | Name of Operation Assembling of Leadframe | Curing of Adhesive Tape |
| --- | --- | --- |
| Adhesive Tapes of Examples 1–51 | 120° C./2 sec./ 4 kg/cm² | 250° C./90 sec. |
| Adhesive Tape of Comparative Example 1 | 120° C./2 sec./ 4 kg/cm² | 150° C./3 hrs. |
| Adhesive Tape of Comparative Example 2 | 350° C./15 sec./ 20 kg/cm² | None |
| Adhesive Tape of Comparative Example 3 | 120° C./2 sec./ 4 kg/cm² | 250° C./90 sec. |
| Adhesive Tape of Comparative Example 4 | 120° C./2 sec./ 4 kg/cm² | 250° C./90 sec. |

Assembling of Semiconductor Package

Thereafter, the produced leadframe was used to assemble a package according to the following procedures. The reason why the conditions of adhering and curing were different at the time of assembling the package is that the characteristics of the adhesives are different from each other. Here, optimum conditions for each adhesive were selected, and the adhesive was cured based on such conditions. (a) Die Bonding A semiconductor chip was adhered to a netal plane portion with a silver paste for die bonding, which was then cured at 150° C. for 2 hours. (b) Wire Bonding Using a wire bonder, a wire pad on the semiconductor chip and a silver plated portion at the end of the inner lead were connected with a gold wire. (c) Molding Using an epoxy molding compound, transfer molding was carried out. (d) Finishing Stage Via stages of forming, dum bar cutting, solder plating on the outer leads, etc., the packaging was finished.

The Results of Evaluations of Adhesive Tapes and Semiconductor Packages (a) Temperature range of Taping The evaluation of whether or not the adhesive tape could be easily and rapidly adhered to the substance to be adhered, i.e., the metal plane or lead pins was carried out. Specifically, the temperature range where each adhesive tape could be adhered by means of a taping machine was determined.

It was found that the adhesive tapes of the present invention and the adhesive tapes of Comparative Example 1 and 4 could be adhered at a temperature range of from 100° to 180° C., but that of Comparative Example 2 required a temperature of not less than 400° C. and that of Comparative Example 3 required a temperature of not less than 250° C. (b) Oxidization of Leadframe The evaluation of whether or not the oxidization took place during curing the adhesive was visually determined by observing the color change on the surface of the leadframe.

As a result, since the adhesive tapes of the present invention could be taped at a low temperature, no oxidation occurred, but in the case of the adhesive tapes of Comparative Example 2 and 3 requiring a high adhesion temperature, the color change was observed, indicating that the leadframe was oxidized. (c) Adhesion Strength A 90° peel strength of 10 mm wide tape at room temperature was measured after the adhesive tape was adhered (taped) onto a copper plate at 140° C.

As a result, the adhesive tapes of the present invention and the adhesive tape of Comparative Example 4 were found to have a strength ranging from 25–40 g/10 mm, while the adhesive tape of Comparative Example 1 had a strength of 2–4 g/10 mm, and those of Comparative Example 2 and 3 had a strength of 10–40 g/10 mm, the last value having a large variation. (d) Void Whether or not the voids formed when the adhesive was cured was within the level problematic for a practical use was visually evaluated by means of a microscope.

As a result, in the adhesive tapes of the present invention, no void could be found, whereas in the adhesive tapes of Comparative Example 1, the formation of voids was found. (e) Processability Handlings (curl, feedability, etc.) when the adhesive tapes were used in order to assemble leadframes, and the surface tackiness of the adhesive tapes were evaluated.

As a result, the adhesive tapes of the present invention was found to have good handling abilities, and that no tacking occurred on the surfaces, but the adhesive of Comparative Example 2 was found to be problematic in handling abilities. (f) Wire Bondability In the assembling of the package, the wire bondability onto the leadframe when wire bonding with the gold wire was determined.

As a result, in the case of using the adhesive tapes of the present invention, no bonding defect was observed in the tests for 832 pins. On the other hand, in the case of Comparative Example 1, bonding defects were observed in 125 of the 832 pins, indicating that the gold wire bonding could not be done with sufficient strength. (g) Evaluation of Semiconductor Packages The packages obtained as described above were tested using the PCBT Test (Pressure Cooker Biased Test). The test was carried out at 5 V of applied voltage at 121° C., at 2 atmospheres and at 100% relative humidity. As a result, in the case of the present invention, no shorting took place even after 1,000 hours. In the case of Comparative Example 4, electric insulation was not kept in 15 samples of 50 samples to be tested when measured by electric conduction test before carrying out the PCBT test.

As is clear from the results described above, in the case of the adhesive tapes for electronic parts of the present invention, the semiconductor package can be produced in a good manner. In contrast, the adhesive tapes of Comparative Examples 1–4 are not suitable for manufacturing electronic parts, because there are problems in that oxidation of leadframe occurs, the conditions for adhering are not suitable for assembling a leadframe, the wire bonding of gold wire cannot be carried out, and electric insulation between the leadframe and the substance to be adhered such as a metal heat spreader, etc. is not kept.

What is claimed is:

1. An adhesive tape for electronic parts which comprises an adhesive layer provided on a surface of metal sheet, said adhesive layer being semi-cured into a B-stage and comprised of: (a) a piperazinylethylaminocarbonyl-containing butadiene-acrylonitrile copolymer having weight average molecular weight of 10,000–200,000, acrylonitrile content of 5–50% by weight, and amino equivalent of 500–10,000, represented by the following formula (I):

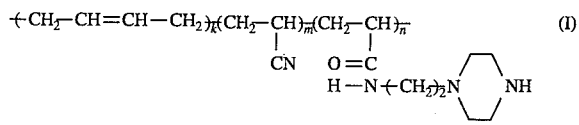

wherein, k, m, and n are molar ratios and taking n as 1, k is a number of 3–175, and m is a number of 0.3 to 93; and (b) a compound having at least two maleimide groups selected from the compounds represented by the following formulae (II-1) to (II-6):

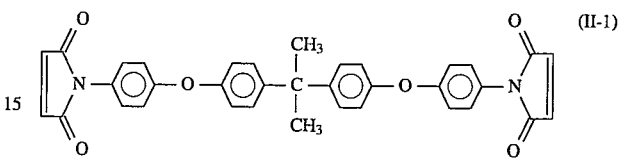

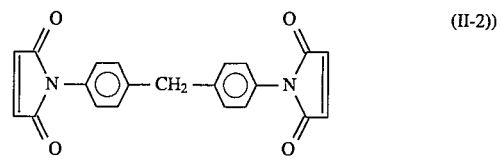

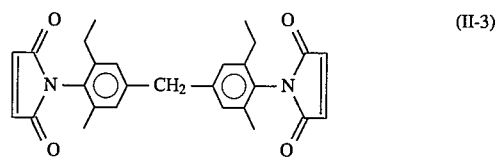

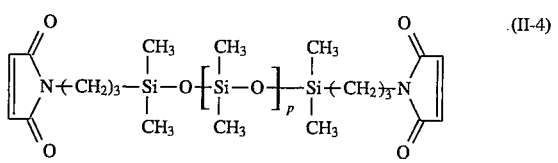

wherein p is an integer of from 0 to 7,

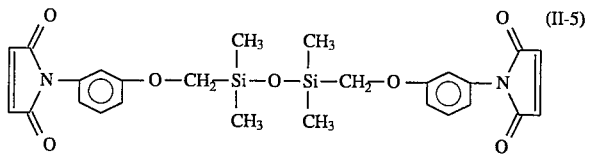

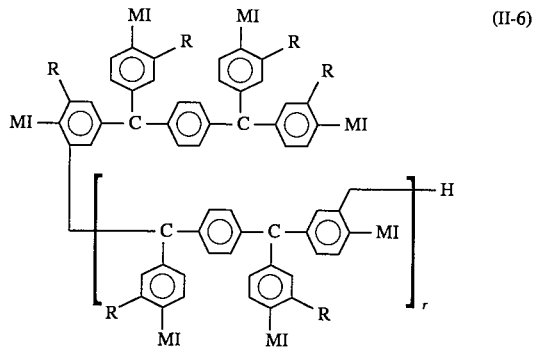

wherein MI=maleimide group, R=H or CH₃, and r=1–5, the ratio of component (b) based on 100 parts by weight of component (a) being in a range of 10 to 900 parts by weight, said adhesive layer being composed of at least two semi-cured layers having each a different status of semi-cure, and the semi-cured layer having a higher status of semi-cure being positioned by the side of the metal sheet.

2. An adhesive tape for electronic parts which comprises two adhesive layers, one of which is provided on one side of a metal sheet and the other is provided on the other side of said metal sheet, said adhesive layers being semi-cured into a B-stage and comprised of: (a) a piperazinylethylaminocarbonyl-containing butadiene-acrylonitrile copolymer having weight average molecular weight of 10,000–200,000, acrylonitrile content of 5–50% by weight, and amino equivalent of 500–10,000, represented by the following formula (I):

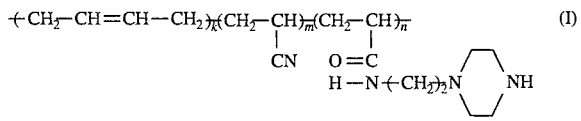  (I)

wherein, k, m, and n are molar ratios and taking n as 1, k is a number of 3–175, and m is a number of 0.3 to 93; and (b) a compound having at least two maleimide groups selected from the compounds represented by the following formulae (II-1) to (II-6):

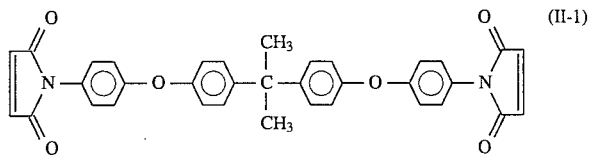  (II-1)

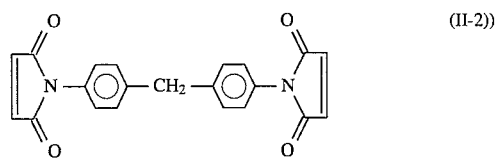  (II-2)

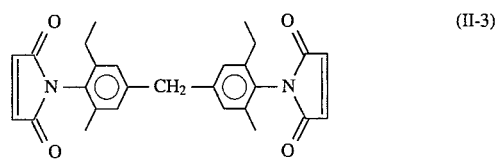  (II-3)

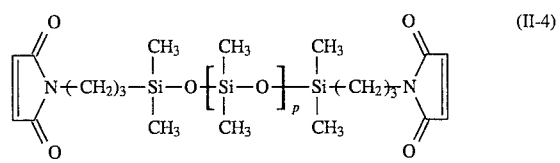  (II-4)

wherein p is an integer of from 0 to 7,

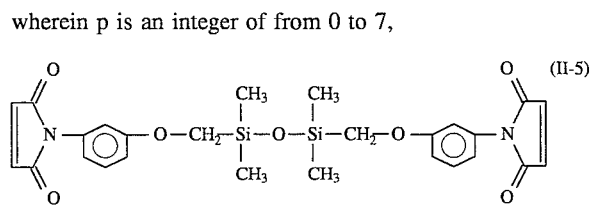  (II-5)

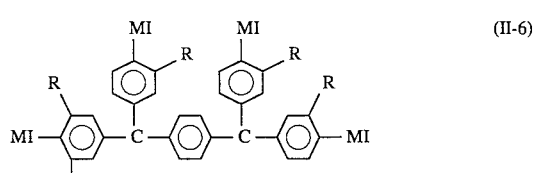  (II-6)

wherein MI=maleimide group, R=H or CH$_3$, and r=1–5; the ratio of component (b) based on 100 parts by weight of component (a) being in a range of 10 to 900 parts by weight, at least one of said adhesive layers being composed of at least two semi-cured layers having each a different status of semi-cure, and the semi-cured layer having a higher status of semi-cure being positioned by the side of the metal sheet.

3. An adhesive tape for electronic parts which comprises an adhesive layer provided on a surface of metal sheet, said adhesive layer being semi-cured into a B-stage and comprised of: (a) a piperazinylethylaminocarbonyl-containing butadiene-acrylonitrile copolymer having weight average molecular weight of 10,000–200,000, acrylonitrile content of 5–50% by weight, and amino equivalent of 500–10,000, represented by the following formula (I):

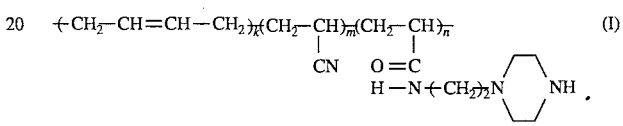  (I)

wherein, k, m, and n are molar ratios and taking n as 1, k is a number of 3–175, and m is a number of 0.3 to 93; (b) a compound having at least two maleimide groups selected from the compounds represented by the following formulae (II-1) to (II-6):

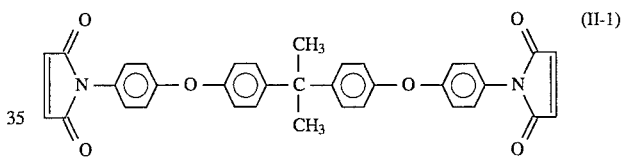  (II-1)

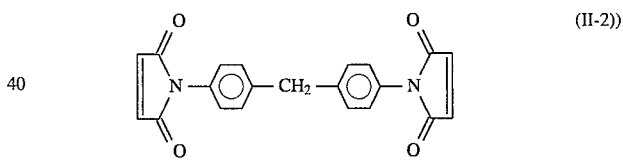  (II-2)

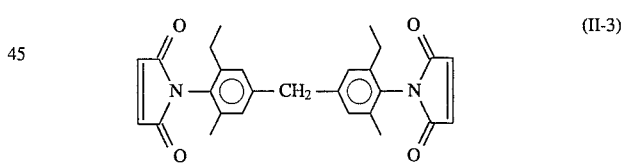  (II-3)

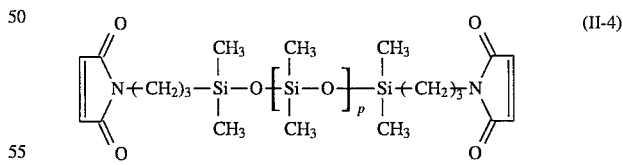  (II-4)

wherein p is an integer of from 0 to 7,

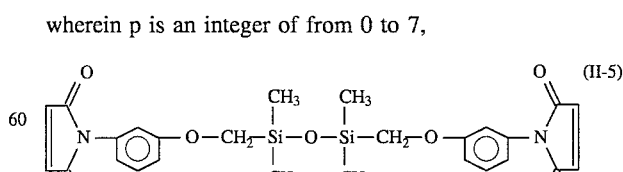  (II-5)

-continued

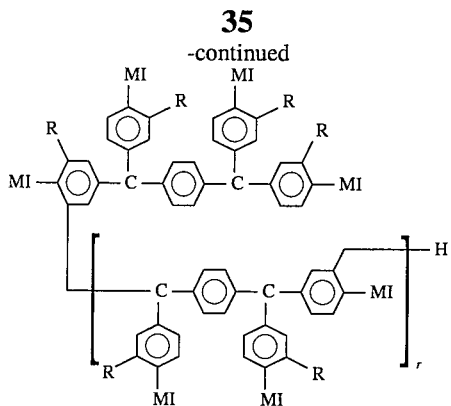

wherein MI=maleimide group, R=H or CH$_3$, and r=1–5; and (c) a diamine compound represented by formula (III):

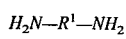

wherein R$^1$ is a dtvalent aliphatic, aromatic, or allcyclic group, or an amino-containing polysiloxane having a weight average molecular weight of 200–7,000 represented by the formula (IV):

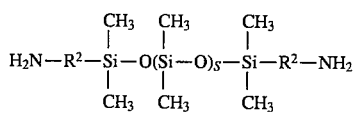

wherein R$^2$ is a divalent aliphatic, aromatic, or alicyclic group, and s is an integer of from 0 to 7; the total amount of components (b) and (c) based on 100 parts by weight of component (a) being 10 to 900 parts by weight, and the molar equivalent of the maleimide group in component (b) per molar equivalent of the amino group in component (c) being 1 to 100 molar equivalent, said adhesive layer being composed of at least two semi-cured layers having each a different status of semi-cure, and the semi-cured layer having a higher status of semi-cure being positioned by the side of the metal sheet.

4. An adhesive tape for electronic parts which comprises two adhesive layers, one of which is provided on one side of a metal sheet and the other is provided on the other side of said metal sheet, said adhesive layers being semi-cured into a B-stage and comprised of: (a) a piperazinylethylaminocarbonyl-containing butadiene-acrylonitrile copolymer having weight average molecular weight of 10,000–200,000, acrylonitrile content of 5–50% by weight, and amino equivalent of 500–10,000, represented by the following formula (I):

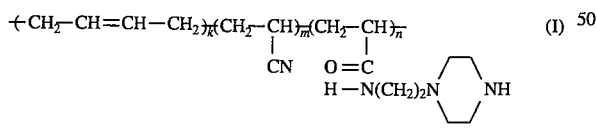

wherein, k, m, and n are molar ratios and taking n as 1, k is a number of 3–175, and m is a number of 0.3 to 93; (b) a compound having at least two maleimide groups selected from the compounds represented by the following formulae (II-1) to (II-6):

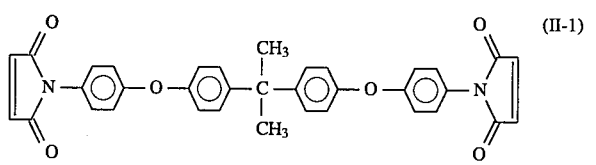

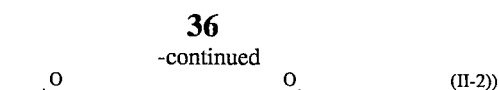

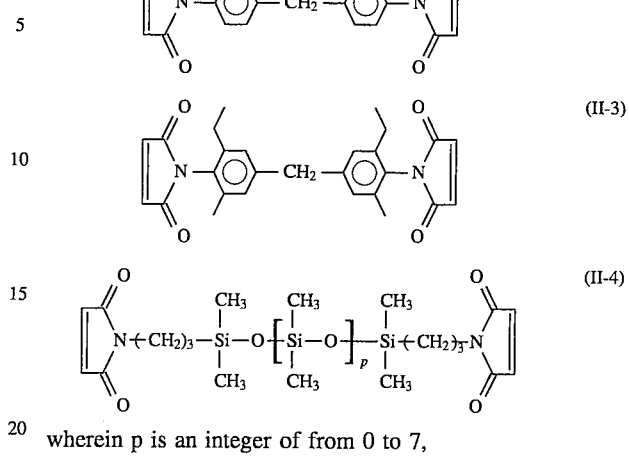

wherein p is an integer of from 0 to 7,

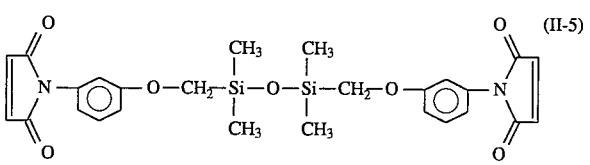

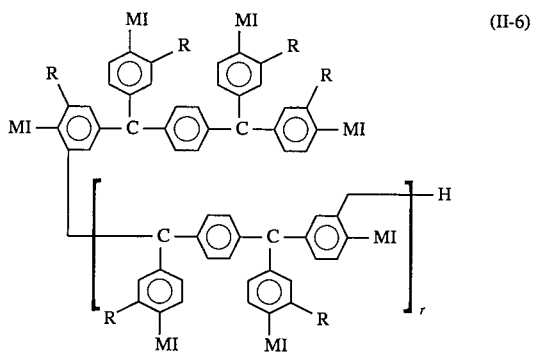

wherein MI-maleimide group, R=H or CH$_3$, and r=1–5; and (c) a diamine compound represented by formula (III):

wherein R$^1$ is a divalent aliphatic, aromatic, or allcyclic group, or an amino-containing polysiloxane having a weight average molecular weight of 200–7,000 represented by the formula (IV):

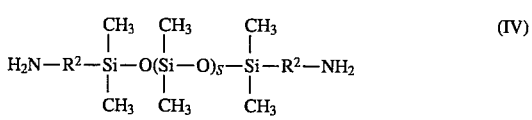

wherein R$^2$ is a divalent aliphatic, aromatic, or allcyclic group, and s is an integer of from 0 to 7; the total amount of components (b) and (c) based on 100 parts by weight of component (a) being 10 to 900 parts by weight, and the molar equivalent of the maleimide group in component (b) per molar equivalent of the amino group in component (c) being 1 to 100 molar equivalent, at least one of said adhesive layers being composed of at least two semi-cured layers having each a different status of semi-cure, and the semi-cured layer having a higher status of semi-cure being positioned by the side of the metal sheet.

5. The adhesive tape for electronic parts claimed in claim 1 wherein a release film is laminated on a suface of the adhesive layer.

6. The adhesive tape for electronic parts as claimed in claim 1 wherein 4 to 40% by weight of a filler having a particle size of not more than 1 µm is contained in the adhesive layer.

7. The adhesive tape for electronic parts as claimed in claim 1 wherein said adhesive layer cured into the B-stage is a laminate consisting of a semi-cured layer having a higher status of semi-cure in a range of 0.01–0.3 µm/sec of the slipping velocity and a semi-cured layer having a lower status of semi-cure in a range of 0.1–10.0 µm/sec of the slipping velocity, and the slipping velocity ($V_1$) of the semi-cured layer having a higher status of semi-cure, and the slipping velocity ($V_2$) of the semi-cured layer having a lower status of semi-cure has the relation of $V_2 > V_1$.

8. The adhesive tape for electronic parts as claimed in claim 1 wherein said metal sheet has a thickness in a range of 10–300 µm.

9. The adhesive tape for electronic parts as claimed in claim 8, wherein said metal sheet is made of at least one selected from the group consisting of copper, cupro-nickel, silver, iron, 42-alloy and stainless steel.

* * * * *